(12) United States Patent
Kuwabata et al.

(10) Patent No.: US 11,532,767 B2
(45) Date of Patent: Dec. 20, 2022

(54) SEMICONDUCTOR NANOPARTICLES, PRODUCTION METHOD THEREOF, AND LIGHT-EMITTING DEVICE

(71) Applicants: OSAKA UNIVERSITY, Osaka (JP); National University Corporation Tokai National Higher Education and Research System, Nagoya (JP); NICHIA CORPORATION, Anan (JP)

(72) Inventors: Susumu Kuwabata, Ibaraki (JP); Taro Uematsu, Suita (JP); Kazutaka Wajima, Toyonaka (JP); Tsukasa Torimoto, Nagoya (JP); Tatsuya Kameyama, Nagoya (JP); Daisuke Oyamatsu, Tokushima (JP)

(73) Assignees: OSAKA UNIVERSITY, Osaka (JP); National University Corporation Tokai National Higher Education and Research System, Nagoya (JP); NICHIA CORPORATION, Anan (JP)

( * ) Notice: Subject to any disclaimer, the term of this patent is extended or adjusted under 35 U.S.C. 154(b) by 191 days.

(21) Appl. No.: 16/970,329

(22) PCT Filed: Feb. 15, 2019

(86) PCT No.: PCT/JP2019/005616
§ 371 (c)(1),
(2) Date: Aug. 14, 2020

(87) PCT Pub. No.: WO2019/160094
PCT Pub. Date: Aug. 22, 2019

(65) Prior Publication Data
US 2021/0083146 A1  Mar. 18, 2021

(30) Foreign Application Priority Data

Feb. 15, 2018 (JP) .............................. JP2018-025435
Oct. 18, 2018 (JP) .............................. JP2018-196802

(51) Int. Cl.
*H01L 33/26* (2010.01)
*B82Y 20/00* (2011.01)
(Continued)

(52) U.S. Cl.
CPC .............. *H01L 33/26* (2013.01); *B82Y 20/00* (2013.01); *B82Y 40/00* (2013.01); *H01L 33/005* (2013.01); *H01L 33/50* (2013.01)

(58) Field of Classification Search
None
See application file for complete search history.

(56) References Cited

U.S. PATENT DOCUMENTS

| 2010/0193806 A1 | 8/2010 | Byun |
| 2017/0267924 A1 | 9/2017 | Kuwabata et al. |
| 2018/0066183 A1 | 3/2018 | Torimoto et al. |

FOREIGN PATENT DOCUMENTS

| JP | 2010177656 A | 8/2010 |
| JP | 2012212862 A | 11/2012 |

(Continued)

OTHER PUBLICATIONS

"Precursor reactivity differentiation for single-step preparation of Ag2Se@Ag2S core-shell nanocrystals with distinct absorption and emission properties enabling sensitive near-infrared photodetection" by Tang et al. (Year: 2018).*

(Continued)

*Primary Examiner* — Evren Seven
(74) *Attorney, Agent, or Firm* — Hunton Andrews Kurth LLP

(57) ABSTRACT

Provided is a method of producing semiconductor nanoparticles that exhibit a band-edge emission, and are superior in quantum yield. The method includes raising the temperature of a first mixture containing a silver (Ag) salt, a salt containing at least one of indium (In) and gallium (Ga), a (Continued)

solid compound that serves as a supply source of sulfur (S), and an organic solvent to a temperature in a range of from 125° C. to 175° C., and heat-treating, subsequent to the raising of the temperature, the first mixture at a temperature in a range of from 125° C. to 175° C. for three seconds or more to obtain a solution containing semiconductor nanoparticles, and decreasing the temperature of the solution containing semiconductor nanoparticles. The solid compound that serves as a supply source of S contains thiourea.

6 Claims, 6 Drawing Sheets

(51) Int. Cl.
  *B82Y 40/00* (2011.01)
  *H01L 33/00* (2010.01)
  *H01L 33/50* (2010.01)

(56) References Cited

FOREIGN PATENT DOCUMENTS

| JP | 2018039971 A | 3/2018 |
| JP | 2018044142 A | 3/2018 |
| WO | 2014129067 A1 | 8/2014 |
| WO | 2018159699 A1 | 9/2018 |

OTHER PUBLICATIONS

"Magnetic solid-phase extraction of trace-level mercury(II) ions using magnetic core-shell nanoparticles modified with thiourea-derived chelating agents" by Cui et al. (Cui) (Year: 2015).*
International Search Report based on International Application No. PCT/JP2019/005610 dated Dec. 3, 2019, 5 pages.
"Improving the stirrer parameters in thiourea crystallization technics", Journal of Guangxi University of Technology, vol. 16, No. 4, Dec. 2005, pp. 78-81, 4 pages.

* cited by examiner

SEMICONDUCTOR NANOPARTICLES, PRODUCTION METHOD THEREOF, AND LIGHT-EMITTING DEVICE

CROSS-REFERENCE TO RELATED APPLICATION

This application is a national phase of PCT/JP2019/005616 filed Feb. 15, 2019, which claims priority to Japan Patent Application No. 2018-025435 filed on Feb. 15, 2018 and Japan Patent Application No. 2018-196802 filed on Oct. 18, 2018, which is incorporated herein by reference in its entirety.

TECHNICAL FIELD

The present disclosure relates to semiconductor nanoparticles, a production method thereof, and a light-emitting device.

BACKGROUND ART

Semiconductor particles with a particle diameter of, for example, 10 nm or less are known to exhibit a quantum size effect, and such nanoparticles are referred to as "quantum dots" (also referred to as "semiconductor quantum dots"). Quantum size effect is a phenomenon where a valence band and a conduction band, each of which is regarded as continuous in bulk particles, become discrete when the particle diameter is on the nanoscale, and the band-gap energy varies in accordance with their particle diameters.

Quantum dots absorb light and change the wavelength of the light corresponding to their band-gap energy. Thus, white light-emitting devices using emission of quantum dots are proposed (refer to, for example, Japanese Unexamined Patent Application Publications No. 2012-212862 and No. 2010-177656). More specifically, light emitted from a light-emitting diode (LED) chip is partially absorbed by quantum dots, and the light emission from the quantum dots and the light emission from the LED chip are mixed to produce white light. In these patent application documents, use of Group 12-Group 16 binary quantum dots, such as CdSe or CdTe, or Group 14-Group 16 binary quantum dots, such as PbS or PbSe, is proposed. Also, a wavelength conversion film containing core-shell-structured semiconductor quantum dots not containing Cd nor Pb in consideration of the toxicity of compounds containing these elements is proposed (refer to, for example, International Patent Publication No. WO 2014-129067).

SUMMARY OF THE INVENTION

Problems to be Solved by the Invention

An aspect of the present disclosure is directed to providing semiconductor nanoparticles that exhibit a band-edge emission with a superior quantum yield, and a production method thereof.

Means for Solving the Problem

A first aspect of the present disclosure is directed to core-shell semiconductor nanoparticles each including a core and a shell disposed on the surface of the core, and emitting light when irradiated with light. The core may contain silver (Ag), at least one of indium (In) and gallium (Ga), and sulfur (S). The shell may contain a semiconductor essentially composed of a Group 13 element and a Group 16 element, and having a greater band-gap energy than the core. The core-shell semiconductor nanoparticles may have an essentially tetragonal crystal structure, and an emission peak with a half-bandwidth of 70 nm or less.

A second aspect of the present disclosure is directed to a method of producing semiconductor nanoparticles. The method may include raising a temperature of a first mixture containing a silver (Ag) salt, a salt containing at least one of indium (In) and gallium (Ga), a solid compound that contains thiourea and serves as a supply source of sulfur (S), and an organic solvent to a temperature in the range of from 125° C. to 175° C., and heat-treating, subsequent to the raising of the temperature, the first mixture at a temperature in the range of from 125° C. to 175° C. for three seconds or more to obtain a solution containing semiconductor nanoparticles, and decreasing the temperature of the solution containing semiconductor nanoparticles.

Advantageous Effect of the Invention

According to an aspect of the present disclosure, semiconductor nanoparticles that exhibit a band-edge emission, and have superior quantum yield, and a production method thereof can be provided.

MODE FOR CARRYING OUT THE INVENTION

Figure 1:
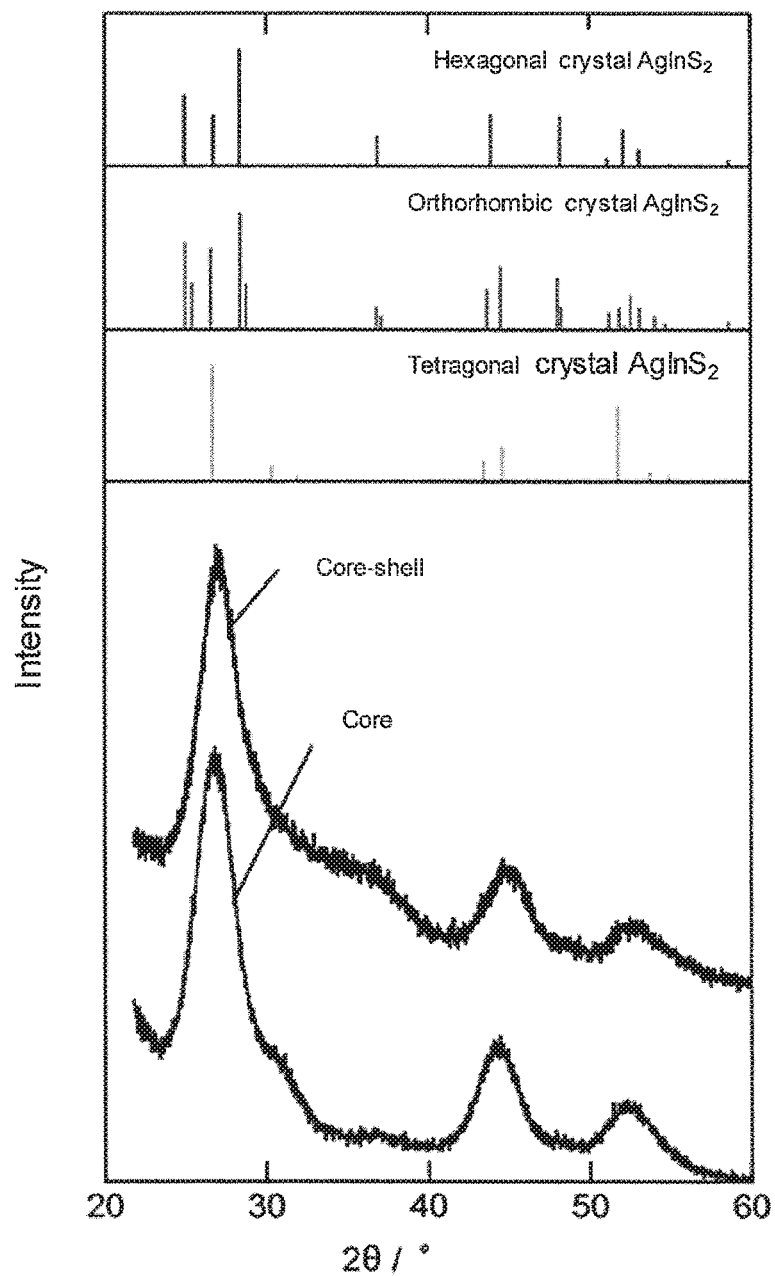
FIG. 1 shows XRD patterns of the semiconductor nanoparticles (core) and the core-shell semiconductor nanoparticles (core-shell) produced in Example 1.

As used herein, the term "step" means not only an independent step but also a step which cannot be clearly distinguished from the other steps but that can achieve the desired object. When a plurality of substances corresponding to a component are present in a composition, the amount of the component means the total amount of the corresponding substances present in the composition unless otherwise specified. The embodiments will now be described in detail. However, the embodiments shown below are mere examples of the semiconductor nanoparticles, the production method thereof, and the light-emitting device for embodying the technical concept of the present invention, and the present invention is not limited to the semiconductor nanoparticles, the production method thereof, and the light-emitting device described below.

Core-Shell Semiconductor Nanoparticles

The first aspect are core-shell semiconductor nanoparticles each containing a core and a shell disposed on the surface of the core, and emitting light when irradiated with light. The core contains silver (Ag), at least one of indium (In) and gallium (Ga), and sulfur (S). The shell contains a semiconductor essentially composed of a Group 13 element and a Group 16 element, and having a greater band-gap energy than the core. The core-shell semiconductor nanoparticles have an essentially tetragonal crystal structure, and an emission peak with a half-bandwidth of 70 nm or less. The core-shell semiconductor nanoparticles exhibit a band-edge emission with a superior quantum yield. This is probably because, for example, the core-shell semiconductor nanoparticles have an essentially tetragonal crystal structure.

Core

The semiconductor nanoparticles that are the core may contain Ag, at least one of In and Ga, and S. Semiconductor nanoparticles containing Ag, In, and S, and having a tetragonal, hexagonal, or orthorhombic crystal structure are introduced, for example, in literature typically as those represented by a composition formula $AgInS_2$. However, they may not actually have a stoichiometric composition represented by the above general formula, and can have a ratio of the atomic number, in particular, of Ag to the atomic number of In and Ga (Ag/In+Ga) of less than 1, or conversely, greater than 1. Also, the sum of the atomic number of Ag and the atomic numbers of In and Ga may not be equal to the atomic number of S. In the present specification, the composition of the semiconductors containing specific elements is thus represented by Ag—In—S by connecting the constituent elements with "-" in the situation where whether the composition is stoichiometric or not is irrelevant. Thus, the semiconductor nanoparticles according to the present embodiment may be Ag—In—S, or Ag—In—Ga—S or Ag—Ga—S where In, a Group 13 element in Ag—In—S is partially or entirely replaced by Ga, another Group 13 element.

Among the semiconductor nanoparticles containing the above-described elements, those having a hexagonal crystal structure are wurtzite-type, and those having a tetragonal crystal structure are chalcopyrite-type. A crystal structure is identified by, for example, measuring an X-ray diffraction (XRD) pattern obtained by XRD analysis. Specifically, the XRD pattern obtained from the semiconductor nanoparticles is compared with the XRD patterns known as those of the semiconductor nanoparticles represented by the composition $AgInS_2$, or XRD patterns obtained through simulation using crystal structure parameters. If there is a pattern among the known patterns and the simulated patterns that corresponds to the pattern of the semiconductor nanoparticles, the semiconductor nanoparticles have a crystal structure of the pattern of the corresponding known or simulated pattern.

In an aggregate of the semiconductor nanoparticles, a plurality of different types of the semiconductor nanoparticles with different crystal structures may be mixed. In that case, peaks derived from the plurality of crystal structures may be observed in the XRD pattern. The core-shell semiconductor nanoparticles according to the first aspect are essentially tetragonal, and thus a peak corresponding to a tetragonal structure is observed, and no peaks derived from other crystal structures are essentially observed.

Although Ag may be partially replaced by and contain at least one of the elements Cu and Au, it is preferably essentially composed of Ag. As used herein, "essentially" indicates that the ratio of other elements than Ag are contained at a rate of, for example, 10% or less, preferably 5% or less, and more preferably 1% or less relative to Ag.

Although at least one of In and Ga may be partially replaced by and contain at least one of the elements Al and Tl, it is preferably essentially composed of at least one of In and Ga. As used herein, "essentially" indicates that the other elements than In and Ga are contained at a rate of, for example, 10% or less, preferably 5% or less, and more preferably 1% or less relative to the sum of In and Ga.

Although S may be partially replaced by and contain at least one of the elements Se and Te, it is preferably essentially composed of S. As used herein, "essentially" indicates that the other elements than S are contained at a rate of, for example, 10% or less, preferably 5% or less, and more preferably 1% or less relative to S.

The semiconductor nanoparticles may be formed essentially from Ag, In, Ga, and S, and other elements partially replacing these elements. As used herein, the term "essentially" is used considering unavoidable inclusion of other elements than Ag, In, Ga, and S, and the above-described other elements partially replacing these elements due to, for example, contamination of impurities.

Shell

The shell may be formed from a semiconductor containing Group 13 and 16 elements and having a greater band-gap energy than the semiconductor forming the core. Examples of the Group 13 element include B, Al, Ga, In, and Tl, and examples of the Group 16 element include O, S, Se, Te, and Po. The semiconductor forming the shell may contain a single Group 13 element alone, or two or more Group 13 elements, and a single Group 16 element alone, or two or more Group 16 elements.

The shell may be formed from a semiconductor essentially composed of Group 13 and 16 elements. As used herein, "essentially" indicates that the other elements than Group 13 and 16 elements are contained at a rate of, for example, 10% or less, preferably 5% or less, and more preferably 1% or less when the total atomic number of all the elements contained in the shell is 100%.

The shell may be formed by selecting the composition and others in accordance with the band-gap energy of the core semiconductor. Alternatively, when the shell has a predetermined composition and others, the core may be designed such that the core semiconductor has a band-gap energy smaller than that of the shell. A semiconductor formed from Ag—In—S typically has a band-gap energy of from 1.8 eV to 1.9 eV.

Specifically, the shell semiconductor may have a band-gap energy of, for example, from 2.0 eV to 5.0 eV, and particularly from 2.5 eV to 5.0 eV. The shell may have a band-gap energy greater than the band-gap energy of the core by, for example, from about 0.1 eV to 3.0 eV, particularly from about 0.3 eV to 3.0 eV, and more particularly from about 0.5 eV to 1.0 eV. When the difference between the band-gap energy of the shell semiconductor and the band-gap energy of the core semiconductor is not less than the lower limit, light emission from the core other than its band-edge emission tends to be smaller in ratio, resulting in a greater band-edge emission ratio.

The band gap energies of the semiconductors forming the core and the shell are preferably selected to give a type-I band alignment where the core band-gap energy exists between the shell band-gap energy at the heterojunction of the core and the shell. The type-I band alignment enables a further satisfactory band-edge emission from the core. In the type-I alignment, at least 0.1 eV barrier is preferably formed, and particularly 0.2 eV or more, and more particularly 0.3 eV or more barrier may be formed between the core band gap and the shell band gap. The upper limit of the barrier is, for example, 1.8 eV or less, and particularly 1.1 eV or less. With the barrier not less than the lower limit, light emission from the core other than its band-edge emission tends to be smaller in ratio, resulting in a greater band-edge emission ratio.

The shell semiconductor may contain In or Ga as a Group 13 element. Also, the shell may contain S as a Group 16 element. The semiconductor containing In or Ga, or S tends to have a greater band-gap energy than the core semiconductor described above.

The shell semiconductor may have a crystal system in accord with the crystal system of the core semiconductor, and have a lattice constant the same as or close to the lattice constant of the core semiconductor. The shell formed from a semiconductor with a crystal system in accord with the crystal system of the core, and a lattice constant close to the lattice constant of the core (including a shell lattice constant close to the core lattice constant when multiplied) can cover the periphery of the core satisfactorily. For example, the core described above is typically tetragonal, and examples of the crystal system in accord with t his include tetragonal and orthorhombic crystals. An Ag—In—S with a tetragonal crystal system has lattice constants of 5.828 Å (0.5828 nm), 5.828 Å (0.5828 n m), and 11.19 Å (1.119 nm). The shell covering this core preferably has a tetr agonal or cubic crystal system with lattice constants or their multiples close to the lattice constants of Ag—In—S. Alternatively, the shell may be amorphous.

Whether an amorphous shell is formed may be checked by observing the core-shell semiconductor nanoparticles using an HAADF-STEM. Specifically, if an amorphous shell is formed, an area with a regular pattern (e.g., stripes or dots) is observed in the center, and an area with no regular pattern is observed in the periphery through an HAADF-STEM. An HAADF-STEM shows an image with a regular pattern for a substance with a regular structure like a crystal substance, and an image with no regular pattern for a substance with no regular structure like an amorphous substance. Thus, an amorphous shell can be observed as an area clearly distinct from the core, which is shown as an image with a regular pattern (with a crystal structure such as a tetragonal crystal system as described above).

When the shell is formed from GaS, the shell is likely shown as a darker area than the core area in an image obtained through an HAADF-STEM because Ga is a lighter element than Ag and In contained in the core.

Whether an amorphous shell is formed may also be checked by observing the core-shell semiconductor nanoparticles according to the present embodiment through a high-resolution transmission electron microscope (HRTEM). In the image obtained through an HRTEM, the core area is observed as a crystal lattice image (an image with a regular pattern), and the shell area is not observed as a crystal lattice image, but as an area of mere black and white contrast with no regular pattern.

The shell preferably forms no solid solution with the core. If the shell forms a solid solution with the core, the two forms a single body. This may ruin the mechanism of the present embodiment where the core is covered with the shell to change the surface state of the core and obtain a band-edge emission. For example, no band-edge emission has been confirmed to be obtained from Ag—In—S core when the surface of the core is covered with zinc sulfide (Zn—S) having a stoichiometric composition or a nonstoichiometric composition. Zn—S satisfies the above requirements of band-gap energy in the relationship with Ag—In—S, and gives a type-I band alignment. Nevertheless, no band-edge emission was obtained from the specific semiconductor. This is probably because the specific semiconductor and ZnS formed a solid solution, which eliminated the interface between the core and the shell.

The shell may contain, for a combination of Group 13 and 16 elements, a combination of In and S, a combination of Ga and S, or a combination of In, Ga, and S, but these are not limitative. The combination of In and S may take a form of indium sulfide, the combination of Ga and S may take a form of gallium sulfide, and the combination of In, Ga, and S may be gallium indium sulfide. The indium sulfide forming the shell may not have a stoichiometric composition ($In_2S_3$). In this sense, indium sulfide may be represented by formula $InS_x$ (where x is not necessarily an integer but may be any number, for example, from 0.8 to 1.5) in the present specification. Similarly, gallium sulfide may not have a stoichiometric composition ($Ga_2S_3$), and in this sense, gallium sulfide may be represented by formula $GaS_x$ (where x is not necessarily an integer but may be any number, for example, from 0.8 to 1.5) in the present specification. Gallium indium sulfide may have a composition represented by $In_{2(1-y)}Ga_{2y}S_3$ (where y is any number greater than 0 and less than 1), or represented by $InaGa_{1-a}S_b$ (where a is any number greater than 0 and less than 1, and b is not necessarily an integer but may be any numerical value).

Indium sulfide having a cubic crystal system and a band-gap energy of from 2.0 eV to 2.4 eV has a lattice constant of 1.0775 nm (10.775 Å). Gallium sulfide having a tetragonal crystal system and a band-gap energy of from about 2.5 eV to 2.6 eV has a lattice constant of 5.215 Å (0.5215 nm). However, these crystal systems and others are reported values, and the actual core-shell semiconductor nanoparticles may have a shell not satisfying these reported values.

Indium sulfide and gallium sulfide are preferably used as a semiconductor forming a shell to be disposed on the core. In particular, gallium sulfide, which has a greater band-gap energy, is preferably used. When gallium sulfide is used, a stronger band-edge emission can be exhibited than when indium sulfide is used.

Core-Shell Structure

The core-shell semiconductor nanoparticles each including the core and the shell disposed on the core may have an average particle diameter of, for example, 50 nm or less. The average particle diameter is preferably within the range of from 1 nm to 20 nm, and more preferably within the range of from 1 nm to 10 nm.

The average particle diameter of the core-shell semiconductor nanoparticles may be obtained, for example, from an image captured using a transmission electron microscope (TEM). The particle diameter of the nanoparticles specifically refers to the length of the longest line segment among the line segments connecting any two points on the circumference of the particle and lying inside the particles observed in a TEM image.

However, for a rod-shaped particle, the length of the short axis is defined as the particle diameter. A rod-shaped particle is a particle having a short axis and a long axis orthogonal to the short axis with a ratio of the long axis to the short axis of greater than 1.2 in a TEM image. Examples of the rod-shaped particles include tetragonal (including rectangular), elliptical, and polygonal particles observed in an TEM image. The rod-shaped particles may have a cross-section, which is a plane orthogonal to the long axis, with, for example, a circular, elliptical, or polygonal shape. Specifically, for a rod-shaped particle with an elliptical cross-section, the length of the long axis is the longest line segment among the line segments connecting any two points on the circumference of the particle. For a rod-shaped particle with a rectangular or polygonal cross-section, the length of the long axis is the longest line segment among the line segments parallel to the longest side among the sides defining the periphery and connecting any two points on the periphery of the particle. The length of the short axis is the longest line segment among the line segments connecting any two points on the periphery of the particle and orthogonal to the line segment defining the length of the long axis.

The average particle diameter of the semiconductor nanoparticles is determined by measuring the particle diameters of all the measurable particles observed in a TEM image captured with a magnification of from 50,000 to 150,000×, and averaging the measured particle diameters. The "measurable" particles as used herein refers to particles entirely observable in a TEM image. Thus, in a TEM image, particles partially not contained in the captured area and observed as partially "cut" particles are not measurable. When a TEM image contains 100 or more measurable particles, their average particle diameter is obtained using the TEM image. When a TEM image contains less than 100 measurable particles, another TEM image is captured in a different site of the particles, and an average particle diameter is obtained by measuring and averaging the particle diameters of 100 or more measurable particles using the two or more TEM images.

In the core-shell semiconductor nanoparticles, the core may have an average particle diameter of, for example, 10 nm or less, and particularly 8 nm or less. The core may have an average particle diameter within the range of from 2 nm to 10 nm, and particularly within the range of from 2 nm to 8 nm. With the core having an average particle diameter within the above range, a quantum size effect is more easily obtained.

The shell may have a shell thickness within the range of from 0.1 nm to 50 nm, within the range of from 0.1 nm to 10 nm, and particularly within the range of from 0.3 nm to 3 nm. With the shell thickness within the above range, the effect resulting from the shell covering the core is satisfactorily achieved, and a band-edge emission is more easily obtained.

The average particle diameter of the core and the thickness of the shell may be obtained by observing the core-shell semiconductor nanoparticles, for example, through an HAADF-STEM. In particular, when the shell is amorphous, the shell can be easily observed as an area different from the core through an HAADF-STEM, and thus the thickness of the shell can easily be obtained. In that case, the particle diameter of the core can be obtained by the technique described above for the semiconductor nanoparticles. When the thickness of the shell is not uniform, the smallest thickness is regarded as the shell thickness of that particle.

Alternatively, the average particle diameter of the core may be measured before the core is covered with the shell. The average particle diameter of the core-shell semiconductor nanoparticles is then measured, and the difference between this average particle diameter and the average particle diameter of the core measured in advance is obtained to determine the thickness of the shell.

The core-shell semiconductor nanoparticles preferably have an essentially tetragonal crystal structure. The crystal structure is identified by, for example, measuring an X-ray diffraction (XRD) pattern obtained by XRD analysis as described above. "Essentially tetragonal" indicates that the ratio of the height of a peak at around 48°, which indicates hexagonal and orthorhombic crystals, to the main peak at around 26°, which indicates tetragonal crystal, is, for example, 10% or less, or 5% or less.

The core-shell semiconductor nanoparticles, when irradiated with light, such as ultraviolet light, visible light, or infrared rays, emit light with a longer wavelength than the irradiated light. Specifically, when irradiated with ultraviolet light, visible light, or infrared rays, the core-shell semiconductor nanoparticles can emit light having a longer wavelength than the irradiated light with the main component having an emission lifetime of 200 ns or less and/or an emission spectrum having a half-bandwidth of 70 nm or less.

The core-shell semiconductor nanoparticles may emit light with an emission peak in the range of from 500 nm to 600 nm when irradiated with light having a peak at around 450 nm. The emission peak wavelength may be from 510 nm to 590 nm, from 520 nm to 585 nm, or from 550 nm to 580 nm. The spectral emission peak may have a half bandwidth of, for example, 70 nm or less, 60 nm or less, 55 nm or less, 50 nm or less, or 40 nm or less. The half bandwidth has a lower limit of, for example, 10 nm or more, 20 nm or more, or 30 nm or more. For example, Ag—In—Ga—S and Ag—Ga—S, which are obtained by partially or entirely replacing In, a Group 13 element, in Ag—In—S by Ga, which is another Group 13 element, have an emission peak shifted to shorter wavelengths.

An "emission lifetime" as used herein means an emission lifetime measured using a device called a fluorescence lifetime measuring device. Specifically, the above "emission lifetime of the main component" may be determined through the procedures below. First, the core-shell semiconductor nanoparticles are irradiated with excitation light to emit light, and then attenuation changes over time (afterglow) are measured for light with a wavelength near the spectral emission peak, for example, for light with a wavelength within the range of the peak wavelength ±50 nm. The changes over time are started to be measured upon termination of irradiation with excitation light. The resulting attenuation curve is typically a sum of a plurality of attenuation curves derived from the relaxation processes of emission, heat, and others. Thus, in the present embodiment, assuming that three components (in other words, three attenuation curves) are contained, parameter fitting is performed such that the attenuation curve is represented by the formula below where I(t) denotes emission intensity. The parameter fitting is performed using a dedicated software.

$$I(t)=A_1\exp(-t/\tau_1)+A_2\exp(-t/\tau_2)+A_3\exp(-t/\tau_3)$$

In the formula above, $\tau_1$, $\tau_2$, and $\tau_3$ of the respective components denote the time required for the initial emission intensity to attenuate to 1/e (36.8%), each of which corresponds to the emission lifetime of each component. $\tau_1$, $\tau_2$, and $\tau_3$ are in ascending order of emission lifetime. $A_1$, $A_2$, and $A_3$ denote contribution percentages of the respective components. For example, when a component having the largest integral value of curves represented by $A_x\exp(-t/\tau_x)$ is defined as the main component, the main component has an emission lifetime τ of 200 ns or less, 100 ns or less, or 80 ns or less.

Such an emission is inferred to be a band-edge emission. In identifying a main component, the value t of $A_x\exp(-t/\tau_x)$ is integrated from 0 to infinite, and the resulting $A_x\times\tau_x$ are compared, and the one with the largest value is defined as the main component.

When parameter fitting is performed assuming that the emission attenuation curve contains 3, 4, or 5 components, the differences are not that much between the respective attenuation curves drawn by the formulae obtained through parameter fitting and the actual attenuation curves. Thus, in the present embodiment, the number of components contained in the emission attenuation curve is assumed to be three to avoid complicated parameter fitting in obtaining the emission lifetime of the main component.

The emission of the core-shell semiconductor nanoparticles may include, in addition to a band-edge emission, a defect emission (for example, a donor-acceptor emission). However, the emission is preferably essentially a band-edge emission alone. A defect emission typically has a longer emission lifetime, a broader spectrum, and a peak at a longer wavelength than a band-edge emission. Essentially a band-edge emission alone as used herein means that the band-edge emission component has a purity of 40% or more, preferably 50% or more, more preferably 60% or more, and still more preferably 65% or more. The upper limit of the purity of the band-edge emission component may be, for example, 100% or less, less than 100%, or 95% or less. "The purity of a band-edge emission component" is represented by the formula below when parameter fitting is performed assuming that a band-edge emission peak and a defect emission peak each have a shape of normal distribution in an emission spectrum, and the band-edge emission peak and the defect emission peak are separated into two areas, denoted as a1 and a2, respectively.

Purity of band-edge emission component (%)=a1/(a1+a2)×100

When the emission spectrum contains no band-edge emission, in other words, when the emission spectrum contains a defect emission alone, the purity is 0%, when the spectrum contains equal peak areas of a band-edge emission and a defect emission, the purity is 50%, and when the spectrum contains a band-edge emission alone, the purity is 100%.

The quantum yield of a band-edge emission is defined as a value obtained by multiplying an internal quantum efficiency that is measured using a quantum yield measuring device at an excitation wavelength of 450 nm at a temperature of 25° C., and calculated within the range of from 506 nm to 882 nm by the above-described purity of the band-edge emission component, and dividing the product by 100. The core-shell semiconductor nanoparticles exhibit a band-edge emission with a quantum yield of, for example, 10% or more, preferably 20% or more, and more preferably 30% or more. The quantum yield may have an upper limit of, for example, 100% or less, less than 100%, or 95% or less.

The semiconductor nanoparticles having a different particle diameter can exhibit a band-edge emission with a peak at a different position. For example, when the semiconductor nanoparticles have a smaller particle diameter, the band-edge emission tends to have a peak wavelength appearing at a shorter wavelength. When the core-shell semiconductor nanoparticles have even more smaller particle diameter, the band-edge emission tends to have a smaller spectral half-bandwidth.

The semiconductor nanoparticles have a band-edge emission with a peak wavelength of, for example, from 500 nm to 600 nm, and preferably from 510 nm to 590 nm, from 520 nm to 585 nm, or from 550 nm to 580 nm. When the semiconductor nanoparticles emit a defect emission as well, the defect emission may have a peak wavelength of, for example, from above 600 nm to 700 nm, or from 605 nm to 690 nm.

When the core-shell semiconductor nanoparticles emit a defect emission, in addition to a band-edge emission, the intensity ratio of the band-edge emission obtained from the maximum peak intensity of the band-edge emission and the maximum peak intensity of the defect emission is, for example, 0.75 or more, preferably 0.85 or more, more preferably 0.9 or more, and particularly preferably 0.93 or more, and the upper limit may be, for example, 1 or less, less than 1, or 0.99 or less. When parameter fitting is performed assuming that the band-edge emission peak and the defect emission peak each have a shape of normal distribution in an emission spectrum, separating the emission spectrum into two of the band-edge emission peak and the defect emission peak, and denoting their respective peak intensities as b1 and b2, the intensity ratio of the band-edge emission is represented by the formula below:

Intensity ratio of band-edge emission=b1/(b1+b2)

When the emission spectrum contains no band-edge emission at all, in other words, when the spectrum contains a defect emission alone, the ratio is 0, when the band-edge emission and the defect emission are equal in peak intensity, the ratio is 0.5, and when the spectrum contains a band-edge emission alone, the ratio is 1.

The semiconductor nanoparticles preferably have an absorption spectrum or an excitation spectrum (also referred to as fluorescent excitation spectrum) with an exciton peak. An exciton peak is a peak resulting from exciton formation. Particles with an exciton peak appearing in their absorption or excitation spectrum demonstrate that the particles have a small particle diameter distribution and less crystal defects, and are suitable for a band-edge emission. The sharper the exciton peak, the more particles with a uniform particle diameter and less crystal defects are contained in an aggregate of the semiconductor nanoparticles. Thus, the semiconductor nanoparticles presumably have an emission with a narrower half-bandwidth and an improved emission efficiency. The semiconductor nanoparticles of the present embodiment have an absorption or excitation spectrum with an exciton peak observed within the range of, for example, from 350 nm to 1000 nm, and preferably 450 nm to 590 nm. In the excitation spectrum for checking the presence or absence of an exciton peak, an observation wavelength for measurement may be set around the peak wavelength.

The shell surface of the core-shell semiconductor nanoparticles may be modified with a surface modifier. Specific examples of the surface modifier include compounds containing phosphorus (P) with a negative oxidation number (hereinafter, also referred to as specific modifier), in addition to the previously mentioned nitrogen-containing compounds having a hydrocarbon group with a carbon number of from 4 to 20, sulfur-containing compounds having a hydrocarbon group with a carbon number of from 4 to 20, and oxygen-containing compounds having a hydrocarbon group with a carbon number of from 4 to 20. The shell surface-modifier containing the specific modifier enables the core-shell semiconductor nanoparticles to exhibit a band-edge emission with an improved quantum yield.

The specific modifier may contain P with a negative oxidation number as the Group 15 element. The oxidation number of P changes to −1 when a single hydrogen atom or a single hydrocarbon group binds to P, whereas the oxidation number of P changes to +1 when an oxygen atom binds to P through a single bond; the oxidation number of P thus varies depending on the substitution state of P. For example, the oxidation number of P is −3 in trialkylphosphine and triarylphosphine, and is −1 in trialkylphosphine oxide and triarylphosphine oxide.

The specific modifier may contain, in addition to P with a negative oxidation number, other Group 15 elements. Examples of the other Group 15 elements include N, As, and Sb.

The specific modifier may be, for example, a phosphorus-containing compound having a hydrocarbon group with a carbon number of from 4 to 20. Examples of hydrocarbon groups with a carbon number of from 4 to 20 include straight or branched saturated aliphatic hydrocarbon groups, such as n-butyl, isobutyl, n-pentyl, n-hexyl, octyl, ethylhexyl, decyl, dodecyl, tetradecyl, hexadecyl, and octadecyl; straight or branched unsaturated aliphatic hydrocarbon groups, such as oleyl; alicyclic hydrocarbon groups, such as cyclopentyl and cyclohexyl; aromatic hydrocarbon groups, such as phenyl and naphthyl; and arylalkyl groups, such as benzyl and naphthyl methyl. Of these, saturated aliphatic hydrocarbon groups and unsaturated aliphatic hydrocarbon groups are preferable. When the specific modifier has a plurality of hydrocarbon groups, they may be the same or different.

Specific examples of the specific modifier include tributylphosphine, triisobutylphosphine, tripentylphosphine, trihexylphosphine, trioctylphosphine, tris(ethylhexyl)phosphine, tridecylphosphine, tridodecylphosphine, tritetradecylphosphine, trihexadecylphosphine, trioctadecylphosphine, triphenylphosphine, tributylphosphine oxide, triisobutylphosphine oxide, tripentylphosphine oxide, trihexylphosphine oxide, trioctylphosphine oxide, tris(ethylhexyl)phosphine oxide, tridecylphosphine oxide, tridodecylphosphine oxide, tritetradecylphosphine oxide, trihexadecylphosphine oxide, trioctadecylphosphine oxide, and triphenylphosphine oxide, and at least one selected from the group consisting of these is preferable.

The shell surface may be surface-modified with other surface modifiers in addition to the specific modifier. Examples of the other surface modifiers include nitrogen-containing compounds having a hydrocarbon group with a carbon number of from 4 to 20, sulfur-containing compounds having a hydrocarbon group with a carbon number of from 4 to 20, and oxygen-containing compounds having a hydrocarbon group with a carbon number of from 4 to 20. Examples of the nitrogen-containing compounds include amines and amides, examples of the sulfur-containing compounds include thiols, and examples of the oxygen-containing compounds include aliphatic acids.

The other surface modifiers are preferably nitrogen-containing compounds having a hydrocarbon group with a carbon number of from 4 to 20, and sulfur-containing compounds having a hydrocarbon group with a carbon number of from 4 to 20. Examples of the nitrogen-containing compounds include alkylamines, such as n-butylamine, isobutylamine, n-pentylamine, n-hexylamine, octylamine, decylamine, dodecylamine, tetradecylamine, hexadecylamine, and octadecylamine, and alkenylamine, such as oleylamine. In particular, n-tetradecylamine is preferable because it has a boiling point of above 290° C. and highly pure one is easily available. Examples of the sulfur-containing compounds include n-butanethiol, isobutanethiol, n-pentanethiol, n-hexanethiol, octanethiol, decanethiol, dodecanethiol, hexadecanethiol, and octadecanethiol.

For the surface modifier, two or more different ones may be used in combination. For example, a compound selected from the above-listed nitrogen-containing compounds (for example, oleylamine) and a compound selected from the above-listed sulfur-containing compound (for example, dodecanethiol) may be used in combination.

The emission of the core-shell semiconductor nanoparticles modified with the specific surface modifier may include, in addition to a band-edge emission, a defect emission (for example, a donor-acceptor emission). However, the emission is preferably essentially a band-edge emission alone. As stated with regard to the core-shell semiconductor nanoparticles, essentially a band-edge emission alone means that the band-edge emission component has a purity of preferably 60% or more, and more preferably 65% or more.

The quantum yield of the band-edge emission from the core-shell semiconductor nanoparticles modified with the specific modifier is measured as described above with regard to the core-shell semiconductor nanoparticles, and the band-edge emission has a quantum yield of, for example, 30% or more, preferably 40% or more, and particularly preferably 50% or more.

Method of Producing Semiconductor Nanoparticles

According to the second aspect of the present disclosure, the method of producing semiconductor nanoparticles may include a temperature-raising step of raising the temperature of a first mixture containing an Ag salt, a salt containing at least one of In and Ga, a solid compound that serves as a supply source of S, and an organic solvent to a temperature in the range of from 125° C. to 175° C., a synthesis step, subsequent to the temperature-raising step, of heat-treating the mixture at a temperature in the range of from 125° C. to 175° C. for three seconds or more to obtain semiconductor nanoparticles, and a cooling step, subsequent to the synthesis step, of decreasing the temperature of the mixture. The solid compound that serves as a supply source of S contains at least thiourea.

In the synthesis of cores (Ag—In—S) containing Ag, In, and S, silver sulfide is first generated, and then the generated silver sulfide reacts with a source of indium, which is probably a typical course of reaction. Here, when the heat-treatment temperature range is set to the range of from 125° C. to 175° C., which is a temperature range necessary for the cores to be synthesized, the cores are generated through cation-exchange reaction between silver sulfide and a salt of indium, and thus the cores obtained have a relatively small diameter. In contrast, when the first mixture is heat-treated at a temperature higher than 175° C., the reaction between indium silver sulfide and indium sulfide becomes predominant, and cores with a relatively large particle diameter are likely obtained, which is believed to reduce quantum size effect. The core-shell semiconductor nanoparticles, each of which contain a core or semiconductor nanoparticles produced by the present production method, and a shell containing a semiconductor essentially containing a Group 13 element and a Group 16 element and having a greater band-gap energy than the core, and being disposed on the surface of the core, have an essentially tetragonal crystal structure, and thus are believed to exhibit a band-edge emission with an improved quantum efficiency. The same is believed to apply to the cores (Ag—In—Ga—S and Ag—Ga—S) obtained when In is partially or entirely replaced by Ga.

The production method of the semiconductor nanoparticles may include first, a temperature-raising step of raising the temperature of a first mixture containing an Ag salt, a salt containing at least one of In and Ga, a solid compound that serves as a supply source of S, and an organic solvent to a temperature in the range of from 125° C. to 175° C.

Examples of the Ag salt and the salt containing at least one of In and Ga to be used for the production method include organic acid salts and inorganic acid salts. Specific examples of the inorganic acid salts include nitrate, acetate, sulfate, hydrochloride, and sulfonate, and specific examples of the organic acid salts include acetate and acetylacetonate salts. Of these, organic acid salts, which are highly soluble in organic solvents, are preferable.

In the production method, a source of S in the form of a solid compound is used. The solid compound only needs to be solid at a normal temperature (25° C.). Examples of the solid compound that serves as a source of S include diethyldithiocarbamate; thiourea; and alkylthioureas, such as dimethylthiourea and diethylthiourea. In the production method, a source of S in the form of a liquid compound may be used in combination. Examples of the source of S in the form of a liquid compound include β-dithiones, such as 4-pentanedithione; and dithiols, such as 1,2-bis(trifluoromethyl)ethylene-1,2-dithiol.

The solid compound that serves as source of S preferably contains thiourea. Thiourea is a crystal, and thus can adjust the generation speed of silver sulfide by its particle diameter. The thiourea crystal preferably has an average particle diameter in the range of, for example, from 1 mm to 5 mm. The particle diameter of thiourea crystal can be measured using, for example, an optical microscope with a scale. The thiourea crystal may have an average particle diameter of, for example, from 1 mm to 5 mm. An average particle diameter is calculated as follows. An image in which the periphery of the crystal is visually recognizable is obtained using an optical microscope. The longest line segments among the line segments connecting any two points on the periphery of the crystal and lying inside the crystal is defined as the particle diameter of the crystal. However, for a rod-shaped crystal, the length of the short axis is defined as the particle diameter. The average particle diameter is calculated by measuring and averaging the particle diameters of 100 crystals.

Examples of the organic solvent include amines having a hydrocarbon group with a carbon number of from 4 to 20, particularly, alkylamines or alkenylamines with a carbon number of from 4 to 20, thiols having a hydrocarbon group with a carbon number of from 4 to 20, particularly alkylthiols or alkenylthiols with a carbon number of from 4 to 20, and phosphines having a hydrocarbon group with a carbon number of from 4 to 20, particularly alkylphosphines or alkenylphosphines with a carbon number of from 4 to 20. These organic solvents can eventually surface-modify resulting semiconductor nanoparticles. Two or more of these organic solvents may be used in combination, and particularly a mixed solvent containing at least one selected from thiols having a hydrocarbon group with a carbon number of from 4 to 20 and at least one selected from amines having a hydrocarbon group with a carbon number of from 4 to 20 in combination may be used. These organic solvents may also be mixed for use with other organic solvents. Also, these organic solvents may be in the form of a solid at a normal temperature as long as it dissolves at 125° C. or more.

The first mixture may be obtained by mixing an Ag salt, a salt containing at least one of In and Ga, a solid compound that serves as a supply source of S, and an organic solvent. The first mixture may be prepared by adding a solid compound that serves as a supply source of S to a solution containing an Ag salt, a salt containing at least one of In and Ga, and an organic solvent. Also, the first mixture may be prepared by preparing a solution containing an Ag salt, a salt containing at least one of In and Ga, and an organic solvent, and adding a solid compound that serves as a supply source of S to the solution while the solution is being heated. The heating temperature is, for example, from 30° C. to 90° C., preferably from 40° C. to 80° C. Also, the first mixture may be a dispersion containing the solid compound at least partially in the form of a solid. Using a source of S in the form of a solid compound facilitates control of the supply rate of S to the reaction site, and enables production of semiconductor nanoparticles having a small particle diameter and a narrow particle size distribution with a high reproducibility.

When thiourea is used as a compound that serves as a source of S, another compound that is in the form of a liquid and serves as a source of S may be used in combination. When used in combination, an Ag salt, a salt containing at least one of In and Ga, and another compound in the form of a liquid are preferably mixed before thiourea is mixed to obtain a first mixture, because this enables adjustment of generation speed of silver sulfide.

In the temperature-raising step, the first mixture is raised to a temperature in the range of from 125° C. to 175° C. The range of temperature to be raised is from 125° C. to 175° C., among this range, preferably from 130° C. to 160° C., and preferably from 135° C. to 150° C. Although the rate is not particularly specified as long as the highest temperature is adjusted not to exceed 175° C., for example, the rate is from 1° C./min to 50° C./min.

The atmosphere for mixing and raising temperature is preferably an inert atmosphere, particularly preferably an argon atmosphere or a nitrogen atmosphere. An inert atmosphere can reduce or prevent production of an oxide as a by-product.

In the synthesis step, the first mixture may be heat-treated for 3 sec or more at a temperature continuously in the range of from 125° C. to 175° C. since the temperature-raising step. This synthesizes semiconductor nanoparticles.

The temperature range for heat-treatment may be from 125° C. to 175° C., and, in terms of quantum yield, preferably from 130° C. to 160° C., and preferably from 135° C. to 150° C.

The time period for heat-treatment is preferably 3 sec or more for quantum efficiency. Although the upper limit of the heat-treatment time is not particularly specified, the time may be, for example, 60 min or less. The heat-treatment time starts at the point of time when the temperature reaches the predetermined temperature in the temperature range (for example, when 150° C. is the predetermined temperature, the time when the temperature reached 150° C.), and ends at the point of time when operation to decrease the temperature is carried out.

The atmosphere for heat-treatment is preferably an inert atmosphere, particularly preferably an argon atmosphere or a nitrogen atmosphere. An inert atmosphere can reduce or prevent production of an oxide as a by-product and oxidation of the surfaces of resulting semiconductor nanoparticles.

The production method of the semiconductor nanoparticles may include, subsequent to the synthesis step, a cooling step of decreasing the temperature of the solution containing semiconductor nanoparticles. The cooling step starts at the point of time when operation to decrease the temperature is carried out, and ends at the point of time when the solution is cooled to 50° C. or less.

The cooling step preferably includes a time period during which the temperature is decreased at a rate of 50° C./min or more to reduce production of silver sulfide from unreacted Ag salt. In particular, the rate is preferably 50° C./min or more at the point of time when the temperature starts to decrease following the operation to decrease the temperature.

The atmosphere during the cooling step is preferably an inert atmosphere, particularly an argon atmosphere or a nitrogen atmosphere. An inert atmosphere can reduce or prevent production of an oxide as a by-product and oxidization of the surfaces of resulting semiconductor nanoparticles.

After the end of the cooling step, the semiconductor nanoparticles may be separated from the solution, or undergo further purification as appropriate. Separation is carried out, after the end of the cooling step, by, for example, centrifuging the solution containing the semiconductor nanoparticles, and taking out the supernatant containing the nanoparticles. In purification, for example, to the supernatant solution, a suitable organic solvent, such as alcohol is added, which is centrifuged to allow the semiconductor nanoparticles to be taken out as a precipitate. The semiconductor nanoparticles can be taken out also by volatilizing the supernatant solution. The taken-out precipitate may be dried, for example, by drying under reduced pressure, or natural drying, or by a combination of drying under reduced pressure and natural drying. Natural drying may be carried out by, for example, leaving the precipitate in the atmosphere at a normal temperature and a normal pressure, and in that case, the precipitate may be left to stand for 20 hours or more, for example, for 30 hours or more.

Alternatively, the taken-out precipitate may be dispersed in a suitable organic solvent. Purification by addition of alcohol and centrifugation may be repeated multiple times as appropriate. As an alcohol to be used for purification, a lower alcohol with a carbon number of 1 to 4, such as methanol, ethanol, or n-propyl alcohol may be used. When the precipitate is dispersed in an organic solvent, a halogen solvent, such as chloroform, or a hydrocarbon solvent, such as toluene, cyclohexane, hexane, pentane, or octane may be used as the organic solvent.

Method of Producing Core-Shell Semiconductor Nanoparticles

The method of producing core-shell semiconductor nanoparticles includes a preparation step of mixing a fluid dispersion containing the semiconductor nanoparticles obtained by the previously described production method of the semiconductor nanoparticles, a compound containing a Group 13 element, and a Group 16 element in the form of a single substance or a compound containing a Group 16 element to obtain a second mixture, and a shell formation step of heat-treating the second mixture.

In the fluid in which the semiconductor nanoparticles are dispersed, no scattering of light occurs, and thus the fluid dispersion is typically transparent (colored or colorless). The solvent in which the semiconductor nanoparticles are dispersed may be any organic solvent as in the preparation of the semiconductor nanoparticles. The organic solvent may be a surface modifier, or a solution containing a surface modifier. For example, the organic solvent may be at least one selected from nitrogen-containing compounds having a hydrocarbon group with a carbon number of from 4 to 20, or at least one selected from sulfur-containing compounds having a hydrocarbon group with a carbon number of from 4 to 20, or a combination of at least one selected from nitrogen-containing compounds having a hydrocarbon group with a carbon number of from 4 to 20 and at least one selected from sulfur-containing compounds having a hydrocarbon group with a carbon number of from 4 to 20, which are the surface modifiers described with regard to the production method of semiconductor nanoparticles. The nitrogen-containing compounds are preferable because they have a boiling point of above 290° C., which is higher than the reaction temperature, and also because highly pure ones are easily available, and specific examples of the organic solvent include oleylamine, n-tetradecylamine, dodecanethiol, and combinations of these.

The fluid dispersion of the semiconductor nanoparticles may be prepared to have an adjusted concentration of particles in the fluid dispersion of, for example, from $5.0 \times 10^{-7}$ mol/L to $5.0 \times 10^{-5}$ mol/L, and particularly from $1.0 \times 10^{-6}$ mol/L to $1.0 \times 10^{-5}$ mol/L. When the rate of the particles in the fluid dispersion is too small, collection of products produced in the aggregation-precipitation process in the poor solvent is not easy. When the rate of the particles is too large, Ostwald ripening and fusion rate by collision of the core materials increases, likely resulting in a wider particle diameter distribution.

A compound containing a Group 13 element serves as a source of a Group 13 element, and examples include organic salts, inorganic salts, and organic metal compounds of Group 13 elements. Examples of the compounds containing a Group 13 element include nitrate, acetate, sulfate, hydrochloride, sulfonate, and acetylacetonate complexes, and preferably organic salts, such as acetate, or organic metal compounds. Organic salts and organic metal compounds are highly soluble in an organic solvent, and likely cause the reaction to proceed more uniformly.

A Group 16 element in the form of a single substance or a compound containing a Group 16 element serves as a source of a Group 16 element. For example, when sulfur (S) is chosen as a Group 16 element for a constituent element of the shell, sulfur in the form of a single substance, such as high-purity sulfur, may be used. Alternatively, a sulfur-containing compound, for example, a thiol, such as n-butanethiol, isobutanethiol, n-pentanethiol, n-hexanethiol, octanethiol, decanethiol, dodecanethiol, hexadecanethiol, or octadecanethiol, a disulfide, such as dibenzyldisulfide, or, thiourea, 1,3-dimethyl thiourea, or a thiocarbonyl compound may be used. In particular, 1,3-dimethylthiourea when used as a Group 16 element source (sulfur source) allows sufficient formation of the shell, which makes it easier to obtain semiconductor nanoparticles that give a strong band-edge emission.

When oxygen (O) is chosen as a Group 16 element for a constituent element of the shell, alcohol, ether, carboxylic acid, ketone, or an N-oxide compound may be used as the source of Group 16 element. When selenium (Se) is chosen as a Group 16 element for a constituent element of the shell, selenium in the form of a single substance, or a compound, such as phosphine selenium oxide, an organic selenium compound (for example, dibenzyl diselenide, diphenyl diselenide) or its hydrides may be used as the source of Group 16 element. When tellurium (Te) is chosen as a Group 16 element for a constituent element of the shell, tellurium in the form of a single substance, phosphine tellurium oxide, or its hydrides may be used as the source of Group 16 element.

In the method of producing core-shell semiconductor nanoparticles, a shell layer may be formed by a technique called slow injection technique. The technique may include increasing the temperature of a fluid dispersion containing the semiconductor nanoparticles to a peak temperature, which is set to be from 200° C. to 310° C., adding in small portions, while maintaining the peak temperature, a mixture solution prepared in advance by dispersing or dissolving a Group 13 element source and a Group 16 element source in an organic solvent, and then decreasing the temperature. In this case, heat-treatment occurs immediately after a second mixture is obtained by mixing the fluid dispersion containing the semiconductor nanoparticles and the mixture solution. The mixture solution may be added at a rate of from 0.1 mL/h to 10 mL/h, and particularly from 1 mL/h to 5 mL/h. The peak temperature may be maintained after the termination of addition of the mixture solution as appropriate.

When the peak temperature is the above-described temperature or higher, the surface modifier modifying the semiconductor nanoparticles sufficiently detaches, and the chemical reaction for generating the shell sufficiently proceeds, and, mainly for these reasons, the formation of the semiconductor layer (shell) tends to proceed sufficiently. When the peak temperature is the above-described temperature or less, the semiconductor nanoparticles tend to have less changes in quality, and a good band-edge emission tends to be obtained. The time during which the peak temperature is maintained, or the retention time of the peak temperature, since the start of the addition of the mixture solution may be from 1 min to 300 min and particularly from 10 min to 20 min in total. The retention time of the peak temperature is selected in relation to the peak temperature. When the peak temperature is lower, the retention time is extended, and when the peak temperature is higher, the retention time is shortened. This can form a suitable shell layer. The rate at which the temperature is raised and the rate at which the temperature is decreased are not particularly specified. After the peak temperature is maintained for a predetermined time, the temperature may be decreased, for example, by stopping the heating source (for example, an electric heater) and releasing the heat.

Alternatively, in the method of producing core-shell semiconductor nanoparticles, the semiconductor layer, or the shell, may be formed on the surfaces of the semiconductor nanoparticles by mixing a fluid dispersion containing the semiconductor nanoparticles, a Group 13 element source, and a Group 16 element source to obtain a second mixture, and then heat-treating the second mixture (heating-up technique). Specifically, heating is carried out by slowly raising the temperature of the second mixture to a peak temperature of from 200° C. to 310° C., and, after maintaining the peak temperature for from 1 min to 300 min, slowly decreasing the temperature. The rate at which the temperature is raised is, for example, from 1° C./min to 50° C./min, but preferably from 50° C./min to 100° C./min until the temperature reaches 200° C. to minimize changes in quality of the cores caused by being heat-treated for an extended time before being covered by the shell. To further raise the temperature thereafter to 200° C. or more, the rate is preferably from 1° C./min to 5° C./min. The rate at which the temperature is decreased may be, for example, from 1° C./min to 50° C./min. The advantage of a predetermined peak temperature being in the above-described range is as described with regard to the slow injection technique.

According to the heating-up technique, core-shell semiconductor nanoparticles that give a stronger band-edge emission than the core-shell semiconductor nanoparticles formed by the slow injection technique tend to be obtained.

In either method, the initial ratio of a Group 13 element source and a Group 16 element source may be determined corresponding to the stoichiometric composition ratio of the compound semiconductor formed from the Group 13 element and the Group 16, but not necessarily correspond to the stoichiometric composition ratio. For example, the initial ratio of a Group 16 element source to a Group 13 element source is from 0.75 to 1.5.

To form a shell with a desired thickness on the semiconductor nanoparticles present in the fluid dispersion, the initial amounts may be selected considering the amount of the semiconductor nanoparticles contained in the fluid dispersion. For example, the initial amounts of a Group 13 element source and a Group 16 element source may be determined to produce a compound semiconductor formed from the Group 13 element and the Group 16 element and having a stoichiometric composition of from 1 µmol to 10 mmol, and particularly from 5 µmol to 1 mmol relative to 10 nmol in an amount-of-substance in terms of particles of the semiconductor nanoparticles; provided, however, that the amount-of-substance in terms of particles refers to the amount by mole when each single particle is regarded as a huge molecule, and is equal to a value obtained by dividing the number of the nanoparticles contained in the fluid dispersion by Avogadro's number ($N_A$=6.022×10$^{23}$).

In the production method of the core-shell semiconductor nanoparticles, it is preferable to use indium acetate or gallium acetylacetonate as a Group 13 element source, sulfur in the form of a single substance, thiourea, or 1,3-dimethyl thiourea as a Group 16 element source, and a mixture solution of oleylamine and dodecanethiol as a fluid dispersion to form a shell containing indium sulfide or gallium sulfide.

Using a mixture solution of oleylamine and dodecanethiol as a fluid dispersion in the heating-up technique can produce core-shell semiconductor nanoparticles that give an emission spectrum in which the peak intensity derived from defect emission is sufficiently smaller than the peak intensity of band-edge emission. This tendency can also be significantly recognized when a gallium source is used as a Group 13 element source.

The shell is formed in this manner to form core-shell-structured core-shell semiconductor nanoparticles. The resulting core-shell-structured core-shell semiconductor nanoparticles may be separated from the solvent, or may be further purified and dried as appropriate. The separation, purification, and drying techniques are as described previously in relation to the semiconductor nanoparticles, and thus the details thereof are omitted here.

When the shell surfaces of the core-shell semiconductor nanoparticles are modified with a specific modifier, the core-shell semiconductor nanoparticles obtained above may undergo a modification step. In the modification step, the core-shell semiconductor nanoparticles and a specific modifier containing phosphorus (P) with a negative oxidation number are contacted to modify the shell surfaces of the core-shell particles. This produces core-shell semiconductor nanoparticles that exhibit a band-edge emission with a yet superior quantum yield.

The contact between the core-shell semiconductor nanoparticles and the specific modifier may be carried out by, for example, mixing a fluid dispersion of the core-shell semiconductor nanoparticles and the specific modifier. The contact may also be carried out by mixing the core-shell particles with the specific modifier in the form of a liquid. For the specific modifier, a solution of the specific modifier may be used. A fluid dispersion of the core-shell semiconductor nanoparticles may be obtained by mixing the core-shell semiconductor nanoparticles and an appropriate organic solvent. Examples of the organic solvent for use in the dispersion include halogen solvents, such as chloroform; aromatic hydrocarbon solvents, such as toluene; aliphatic hydrocarbon solvents, such as cyclohexane, hexane, pentane, and octane. The concentration of the amount-of-substance of the core-shell semiconductor nanoparticles in the fluid dispersion is, for example, from $1\times10^{-7}$ mol/L to $1\times10^{-3}$ mol/L, and preferably from $1\times10^{-6}$ mol/L to $1\times10^{-4}$ mol/L.

The amount of use of the specific modifier relative to the core-shell semiconductor nanoparticles is, for example, from 1 to 50,000 times by mole ratio.

When the core-shell semiconductor nanoparticles in a fluid dispersion have a concentration of the amount-of-substance of from $1.0\times10^{-7}$ mol/L to $1.0\times10^{-3}$ mol/L, the fluid dispersion and the specific modifier may be mixed in a volume ratio of from 1:1000 to 1000:1.

The temperature at which the core-shell semiconductor nanoparticles and the specific modifier are contacted is, for example, from −100° C. to 100° C. or from −30° C. to 75° C. The duration of contact may be selected appropriately in accordance with, for example, the use amount of the specific modifier and the concentration of the fluid dispersion. The duration of contact is, for example, 1 min or more, and preferably 1 hour or more, and 100 hours or less, and preferably 48 hours or less. The atmosphere during contact is, for example, an inert gas atmosphere, such as nitrogen gas or a rare gas.

Light-Emitting Device

The light-emitting device includes a light conversion member and a semiconductor light-emitting element, and the light conversion member includes the core-shell semiconductor nanoparticles described above. The light-emitting device, for example, allows the core-shell semiconductor nanoparticles to absorb a part of light emitted by the semiconductor light-emitting element, and emit light with a longer wavelength. The light from the core-shell-structured semiconductor nanoparticles and light from the semiconductor light-emitting element are mixed, and the mixed light can be used as light emitted by the light-emitting device.

Specifically, using a semiconductor light-emitting element that emits bluish-violet light or blue light with a peak wavelength of from about 400 nm to 490 nm, and the core-shell semiconductor nanoparticles that absorb blue light and emit yellow light can produce a light-emitting device that emits white light. Alternatively, using two types of the core-shell semiconductor nanoparticle: those that absorb blue light and emit green light, and those that absorb blue light and emit red light can also produce a white light-emitting device.

Alternatively, using a semiconductor light-emitting element that emits ultraviolet rays with a peak wavelength of 400 nm or less, and three types of the core-shell semiconductor nanoparticles that absorb ultraviolet rays, and respectively emit blue light, green light, and red light can also produce a white light-emitting device. In this case, the light emitted from the light-emitting element is preferably all absorbed by the semiconductor nanoparticles to prevent ultraviolet rays emitted by the light-emitting element from leaking outside.

Alternatively, using one that emits blue-green light with a peak wavelength of about 490 nm to 510 nm, and using the core-shell semiconductor nanoparticles that absorb this blue-green light and emit red light can produce a white light-emitting device.

Alternatively, using a semiconductor light-emitting element that emits red light with a wavelength of from 700 nm to 780 nm, and using the core-shell semiconductor nanoparticles that absorb red light and emit near-infrared rays can produce a light-emitting device that emits near-infrared rays.

The core-shell semiconductor nanoparticles may be used in combination with other semiconductor quantum dots, or may be used in combination with other non-quantum dot fluorescent materials (for example, organic fluorescent materials or inorganic fluorescent materials). Examples of the other semiconductor quantum dots include binary semiconductor quantum dots as described in the column of Background Art. As a non-quantum dot fluorescent material, a garnet fluorescent material, such as aluminum garnet fluorescent material, may be used. Examples of the garnet fluorescent material include cerium-activated yttrium-aluminum-garnet fluorescent materials and cerium-activated lutetium-aluminum-garnet fluorescent materials. Other usable examples include europium- and/or chromium-activated nitrogen-containing calcium aluminosilicate fluorescent materials, europium-activated silicate fluorescent materials, β-SiAlON fluorescent materials, nitride fluorescent materials, such as CASN or SCASN-based ones, rare-earth nitride fluorescent materials, such as $LnSi_3N_{11}$ or LnSiAlON-based ones, oxynitride fluorescent materials, such as $BaSi_2O_2N_2$:Eu or $Ba_3Si_6O_{12}N_2$:Eu-based ones, sulfide fluorescent materials, such as CaS, $SrGa_2S_4$, $SrA_2O_4$, or ZnS-based ones, chlorosilicate fluorescent materials, $SrLiAl_3N_4$:Eu fluorescent materials, $SrMg_3SiN_4$:Eu fluorescent materials, and $K_2SiF_6$:Mn fluorescent material, which is a manganese-activated fluoride complex fluorescent material.

In the light-emitting device, the light conversion member containing the core-shell semiconductor nanoparticles may be, for example, a sheet member or a plate member, or a three-dimensional member. An example of the three-dimensional member is, in a surface-mount light-emitting diode in which a semiconductor light-emitting element is disposed on the bottom surface of a recess defined in the package, a sealing member formed of a resin that is filled into the recess to seal the semiconductor light-emitting element.

Alternatively, another example of the light conversion member is, in the case where a semiconductor light-emitting element is disposed on a planar substrate, a resin member formed in a manner to surround the top surface and side surfaces of the semiconductor light-emitting element with a substantially uniform thickness. Alternatively, a still another example of the light conversion member is, in the case where a resin member containing a reflective material is filled in the surroundings of a semiconductor light-emitting element such that its top end forms a same plane with the semiconductor light-emitting element, a plane-shaped resin member with a predetermined thickness formed on the semiconductor light-emitting element and the resin member containing the reflective material.

The light conversion member may be in contact with the semiconductor light-emitting element, or may be arranged apart from the semiconductor light-emitting element. Specifically, the light conversion member may be a member in the form of a pellet, a sheet, a plate, or a rod arranged apart from the semiconductor light-emitting element, or a member arranged in contact with the semiconductor light-emitting element, such as a sealing member, a coating member (a member covering the light-emitting element arranged independently from a mold member), or a mold member (including, for example, a lens-shaped member).

In the light-emitting device, when two or more types of the core-shell-structured semiconductor nanoparticles that emit light with different wavelengths are used, the two or more types of the core-shell-structured semiconductor nanoparticles may be mixed in a single light conversion member, or two or more light conversion members each containing a single type of quantum dots alone may be used in combination. In this case, the two or more light conversion members may form a laminated structure, or may be arranged as a pattern in the form of dots or stripes on a plane.

An example of the semiconductor light-emitting element is an LED chip. The LED chip may include a semiconductor layer composed of one or two or more selected from the group including GaN, GaAs, InGaN, AlInGaP, GaP, SiC, and ZnO. A semiconductor light-emitting element that emits bluish-violet light, blue light, or ultraviolet rays includes a semiconductor layer composed of, for example, a GaN compound having a composition represented by $In_XAl_YGa_{1-X-Y}N$ ($0 \leq X$, $0 \leq Y$, $X+Y<1$).

The light-emitting device of the present embodiment is preferably incorporated as a light source in a liquid crystal display. The band edge emission by the core-shell-structured semiconductor nanoparticles has a short emission lifetime. Thus, a light emitting device containing the core-shell semiconductor nanoparticles is suitable as a light source for a liquid crystal display that needs a relatively quick response speed. Also, the core-shell-structured semiconductor nanoparticles according to the present embodiment can emit a band edge emission having an emission peak with a small half bandwidth.

Thus, without using a thick-color filter, a liquid crystal display can have a good color reproducibility by including a light emitting device that includes:

a blue semiconductor light-emitting element that emits blue light with a peak wavelength in the range of 420 nm to 490 nm, the core-shell semiconductor nanoparticles that emit green light with a peak wavelength in the range of from 510 nm to 550 nm, and preferably from 530 nm to 540 nm, and the core-shell semiconductor nanoparticles that emit red light with a peak wavelength in the range of from 600 nm to 680 nm, and preferably from 630 nm to 650 nm; or, a semiconductor light-emitting element that emits an ultraviolet light with a peak wavelength of 400 nm or less, the core-shell-structured semiconductor nanoparticles that emit blue light with a peak wavelength in the range of from 430 nm to 470 nm, and preferably from 440 nm to 460 nm, the core-shell semiconductor nanoparticles that emit green light with a peak wavelength in the range of from 510 nm to 550 nm, and preferably from 530 nm to 540 nm, and the core-shell-structured semiconductor nanoparticles that emit red light with a peak wavelength in the range of from 600 nm to 680 nm, and preferably from 630 nm to 650 nm. The light emitting device may be used, for example, as a direct back light, or an edge backlight.

Alternatively, a sheet formed from, for example, glass or resin, a plate, or a rod containing the core-shell semiconductor nanoparticles may be incorporated as a light conversion member independently from the light-emitting device in a liquid crystal display.

EXAMPLES

The present invention will now be described specifically by means of Examples; however, the present invention is not limited to these Examples.

Recrystallization of Thiourea

To thiourea (Kishida Chemical), a small amount of water was added and heated to dissolve, and then cooled to recrystallize. The crystal was taken out by suction-filtration, and vacuum-dried to obtain a crystal with a size of from about 1 mm to 5 mm.

Example 1

Synthesis of Semiconductor Nanoparticles

In a reaction vessel, 0.4 mmol of silver acetate (AgOAc) and 0.4 mmol of indium acetate (In(OAc)$_3$) were mixed with 8 mL of a distillation-purified oleylamine, and dodecanethiol (1.25 mmol, 300 μL) was added with stirring. The synthesis solution was degassed, purged with an argon atmosphere, and heated to about 70° C., and, with the lid being opened temporarily, a crystal of thiourea (0.8 mmol, 60.8 mg) was added to obtain a first mixture. This is followed by degassing for a very short time, and the temperature was raised at a rate of 30° C./min until it reached 130° C. After the actual measurement reached 130° C., heat treatment was continued for 600 sec. The reaction vessel was then immersed in water at room temperature, and quenched to halt synthesis. During quench, the temperature was decreased at a rate of about 50° C./min on average. After removal of coarse particles by centrifugation, methanol was added to the supernatant to precipitate semiconductor nanoparticles that serve as the core, which were collected by centrifugation. The collected solid was dispersed in 2 mL of oleylamine.

For the resultant semiconductor nanoparticles, the XRD pattern was measured, and compared with tetragonal AgInS$_2$ (chalcopyrite type), hexagonal AgInS$_2$ (wurtzite type), and orthorhombic AgInS$_2$. The measured XRD pattern is shown in FIG. 1. The XRD pattern has no peak at around 48°, which is observed for hexagonal and orthorhombic crystals, so that the semiconductor nanoparticles were confirmed to have a crystal structure essentially approximately the same as tetragonal AgInS$_2$. The XRD pattern was measured using a powder X-ray diffractometer (trade name: SmartLab) by Rigaku.

The shapes of the resultant semiconductor nanoparticles were observed using a transmission electron microscope (TEM, trade name: H-7650 by Hitachi High-Technologies), and the average particle diameter was measured using a TEM image captured at a magnification of from 80000 to 200000×. As a TEM grid, one with a trade name of High Resolution Carbon: HRC-C10 STEM Cu 1001P grid (by Okenshoji) was used. The resultant particles were spherical or polygonal. The average particle diameter was obtained by choosing TEM images captured at least three sites, measuring and averaging the particle diameters of all the countable nanoparticles, in other words, excluding partially cut particles along the edges of the images among the nanoparticles contained in these sites. In all Examples including the present Example and Comparative Examples, the particle diameters of at least 100 nanoparticles in total were measured using three or more TEM images. The average particle diameter of the semiconductor nanoparticles was 4.17 nm.

Subsequently, the amount-of-substance of indium contained in the resultant semiconductor nanoparticles was measured using an ICP emission spectrophotometer (ICPS-7510 by Shimadzu) to be 41.5 μmol. The semiconductor nanoparticles with an average particle diameter of 4.17 nm are calculated to have a volume of 37.95 nm$^3$ when they are assumed to be spherical. A silver indium sulfide crystal when it is tetragonal is calculated to have a unit lattice volume of 0.38 nm$^3$ (lattice constants: 5.828 Å (0.5828 nm), 5.828 Å (0.5828 nm), and 11.19 Å (1.119 nm)), and thus by dividing the volume of the semiconductor nanoparticles by the unit lattice volume, the semiconductor nanoparticles are calculated to have 100 unit lattices per nanoparticle. A silver indium sulfide crystal when it is tetragonal contains four indium atoms per unit lattice, and thus the nanoparticles are calculated to contain 400 indium atoms per nanoparticle. By dividing the amount-of-substance of indium with the number of indium atoms per nanoparticle, the amount-of-substance, in terms of nanoparticles, of the semiconductor nanoparticles is calculated to be 104 nmol.

Synthesis of Core-Shell Semiconductor Nanoparticles 0.1 mmol of gallium acetylacetonate (Ga(acac)$_3$) and 0.1 mmol of 1,3-dimethyl thiourea were measured, and 8 mL of distillation-purified oleylamine and 0.5 mL of the oleylamine dispersion of the semiconductor nanoparticles synthesized above (the amount-of-substance or the number of particles as nanoparticles was 30 nmol) were added to obtain a second mixture. The solution was degassed at around 60° C., and the temperature was then raised at a rate of 60° C./min until it reached 230° C. After reaching 230° C., the temperature was raised at a rate of 2° C./min until it reached 280° C., and heat treatment was carried out for 30 min at 280° C. The temperature was then decreased under room temperature to 150° C., at which vacuuming was carried out once to remove volatile components, such as hydrogen sulfide. When the temperature became 100° C. or less, the flask was immersed in water to quench it to room temperature. Methanol was added to precipitate core-shell particles, and after washing, the resultant core-shell semiconductor nanoparticles were dispersed in chloroform (4 mL).

For the resultant core-shell semiconductor nanoparticles, the average particle diameter and XRD were measured in the same manner as for the semiconductor nanoparticles above. The measured XRD pattern is shown in FIG. 1. The core-shell semiconductor nanoparticles had an average particle diameter of 5.38 nm. The XRD pattern has no peak at around 48°, which is observed for hexagonal and orthorhombic crystals, so that the semiconductor nanoparticles were found to have a structure essentially approximately the same as tetragonal AgInS$_2$.

Modification Step

A 2-mL aliquot was taken from the chloroform dispersion of the resultant core-shell semiconductor nanoparticles, and 2 mL of trioctylphosphine (TOP) was added. After mixing by shaking at room temperature for 10 min, the mixture was left to stand at room temperature for 24 hours to obtain a fluid dispersion of semiconductor nanoparticles, or TOP-modified core-shell particles.

Measurement of Absorption and Emission Spectra and Quantum Yields

Figure 2:
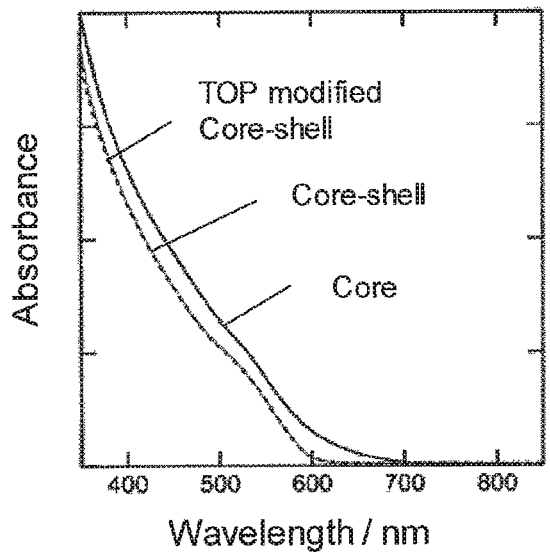
FIG. 2 shows absorption spectra of the semiconductor nanoparticles (core), the core-shell semiconductor nanoparticles (core-shell), and the TOP-modified core-shell semiconductor nanoparticles produced in Example 1.
Figure 3:
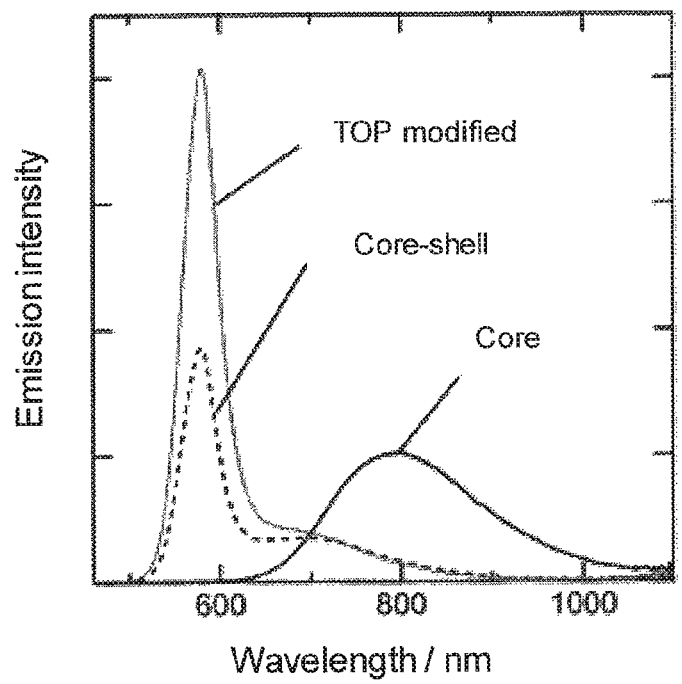
FIG. 3 shows emission spectra of the semiconductor nanoparticles (core), the core-shell semiconductor nanoparticles (core-shell), and the TOP-modified core-shell semiconductor nanoparticles produced in Example 1.

The absorption and emission spectra of the semiconductor nanoparticles, the core-shell semiconductor nanoparticles, and the TOP-modified core-shell semiconductor nanoparticles were measured. The results are shown in FIGS. 2 and 3. The absorption spectra were measured using a UV-Vis-NIR spectrophotometer (trade name: V-670 by JASCO) in the wavelength range of from 350 nm to 850 nm. The emission spectra were measured using a multichannel photodetector (trade name: PMA12 by Hamamatsu Photonics) at an excitation wavelength of 450 nm. The quantum yields were measured using a fluorescent spectrum measuring device (PMA-12 by Hamamatsu Photonics) equipped with an integrating sphere at room temperature (25° C.) and at an excitation wavelength of 450 nm in the wavelength range of from 350 nm to 1100 nm, and calculated in the wavelength range of from 506 nm to 882 nm.

As shown in FIG. 2, the absorption spectrum of the core-shell semiconductor nanoparticles has a slight shoulder at around 500 nm, and there is substantially no absorption at around 600 nm or more, which allows an inference that there is an exciton peak at from around 400 nm to 600 nm. As shown in FIG. 3, a band-edge emission with a half-bandwidth of about 44 nm is observed at around 577 nm. The band-edge emission had a quantum yield of 12.3%, the purity of the band-edge emission component was 44.4%, and the band-edge emission had an intensity ratio of 0.81.

Also, as shown in FIG. 2, the absorption spectrum of the TOP-modified core-shell semiconductor nanoparticles has a slight shoulder at around 500 nm, and there is substantially no absorption at around 600 nm or more, which allows an inference that there is an exciton peak at from around 400 nm to 600 nm. As shown in FIG. 3, a band-edge emission with a half-bandwidth of about 46 nm is observed at around 579 nm. The band-edge emission had a quantum yield of 31.7%, the purity of the band-edge emission component was 67.1%, and the band-edge emission had an intensity ratio of 0.89.

For each of the emissions observed as band-edge emissions of the core-shell semiconductor nanoparticles and the TOP-modified core-shell semiconductor nanoparticles, the emission lifetime was measured. The measurement of the emission lifetime was carried out using a fluorescence lifetime measuring device by Hamamatsu Photonics (trade name: Quantaurus-Tau) by irradiating the core-shell-structured semiconductor nanoparticles with light at a wavelength of 470 nm as excitation light to obtain an attenuation curve at around the peak wavelength of the band-edge emission peak. The resultant attenuation curve was divided into three components through parameter fitting using a fluorescence lifetime measurement/analysis software U11487-01 by Hamamatsu Photonics. The results, $\tau_1$, $\tau_2$, and $\tau_3$, and the respective contribution ratio of these components ($A_1$, $A_2$, and $A_3$) are shown in Table 1 below. Non-TOP modified refers to the non-TOP modified core-shell semiconductor nanoparticles, and TOP-modified refers to the TOP-modified core-shell semiconductor nanoparticles.

TABLE 1

| | $\tau_1$ (ns) | $A_1$ (%) | $\tau_2$ (ns) | $A_2$ (%) | $\tau_3$ (ns) | $A_3$ (%) |
|---|---|---|---|---|---|---|
| non-TOP modified | 2.34 | 48 | 44.6 | 44 | 138 | 8 |
| TOP modified | 15.5 | 35 | 63 | 62 | 298 | 3 |

As shown in Table 1, the main component ($\tau_2$, $A_2$) of the core-shell semiconductor nanoparticles (non-TOP modified) had 44.6 ns, and the main component ($\tau_2$, $A_2$) of the TOP-modified core-shell semiconductor nanoparticles (TOP-modified) had 63.0 ns. These emission lifetimes are about the same as the fluorescence lifetime (from 30 ns to 60 ns) of the component with the largest contribution ratio of fluorescence emitted from CdSe (nanoparticles), whose band-edge emission has been confirmed.

Analysis by Energy Dispersive X-Ray Analyzer

The atomic percentage of each element contained in the TOP-modified core-shell semiconductor nanoparticles was analyzed using an energy dispersive X-ray analyzer (trade name: OCTANE by EDAX). The results are shown in Table 2. As shown in Table 2, the TOP-modified core-shell semiconductor nanoparticles were confirmed to contain P. Assuming that the composition of the core was AgInS$_2$ and the composition of the shell was GaS, the atomic percentage of sulfur calculated from the results for Ag and Ga in Table 2 was 49.4% (13.4×2+22.6/1×1=49.4), showing a good match with the value of S in Table 2.

TABLE 2

| Ag | In | Ga | S | P |
|---|---|---|---|---|
| 13.4% | 14.4% | 22.6% | 45.7% | 3.9% |

Comparative Example 1

Synthesis of Semiconductor Nanoparticles 0.4 mol each of AgOAc and In(OAc), 0.8 mol of thiourea, 11.8 mL of oleylamine, and 0.2 mL of 1-dodecanethiol were added to obtain a mixture. Subsequently, vacuum degassing was carried out (3 min at a normal temperature), and under an argon atmosphere, the temperature was raised at a temperature raising rate of 10° C./min until it reached 200° C. Upon reaching 200° C., the temperature was decreased at a rate of 10° C./min to halt synthesis. To the supernatant by centrifugation, methanol was added to precipitate semiconductor nanoparticles that serve as the core. The precipitate was dispersed in 2 mL of oleylamine.

Figure 4:
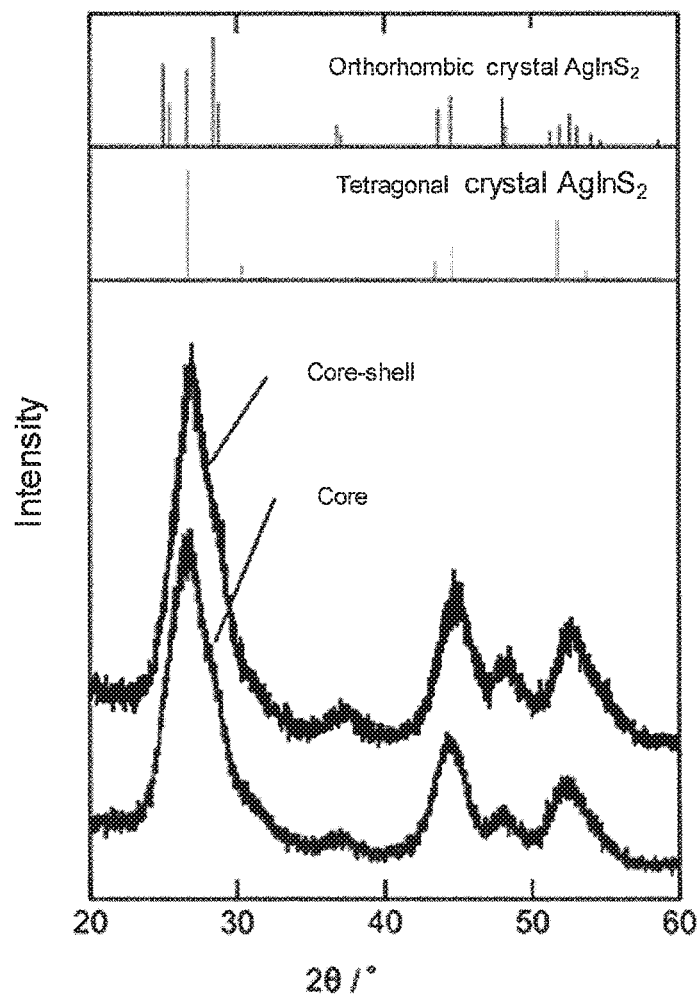
FIG. 4 shows XRD patterns of the semiconductor nanoparticles (core) and the core-shell semiconductor nanoparticles (core-shell) produced in Comparative Example 1.

For the resultant semiconductor nanoparticles, the average particle diameter and XRD were measured as in Example 1. The measured XRD pattern is shown in FIG. 4. The semiconductor nanoparticles had an average particle diameter of 6 nm. The XRD pattern for the semiconductor nanoparticles showed a peak at around 48°, which is observed for hexagonal and orthorhombic crystals.

Synthesis of Core-Shell Particles 0.1 mol of Ga(acac)$_3$, 0.15 mol of sulfur in the form of a single substance were measured, and 12 mL of distillation-purified oleylamine and 0.67 mL of the oleylamine dispersion of the semiconductor nanoparticles synthesized above (the amount-of-substance in terms of nanoparticles was 30 nmol) were added. The solution was degassed at around 60° C., and the temperature was then raised at a temperature raising rate of 10° C./min until it reached 260° C. Heat treatment was carried out at 260° C. for 40 min. Subsequently, the heating source was turned off to release heat. Methanol was added to precipitate core-shell particles, and after washing, the resultant core-shell semiconductors were dispersed in chloroform (4 mL).

For the resultant core-shell semiconductor nanoparticles, the average particle diameter and XRD were measured in the same manner as in Example 1. The measured XRD pattern is shown in FIG. 4. The core-shell semiconductor nanoparticles had an average particle diameter of 8 nm. The XRD pattern for the core-shell semiconductor nanoparticles showed a peak at around 48°, which is observed for hexagonal and orthorhombic crystals. The ratio of the peak height at around 48°, which indicates hexagonal and orthorhombic crystals, to the main peak at around 26°, which indicates a tetragonal crystal, was 21.8%.

Measurement of Absorption, Emission, and Excitation Spectra

Figure 5:
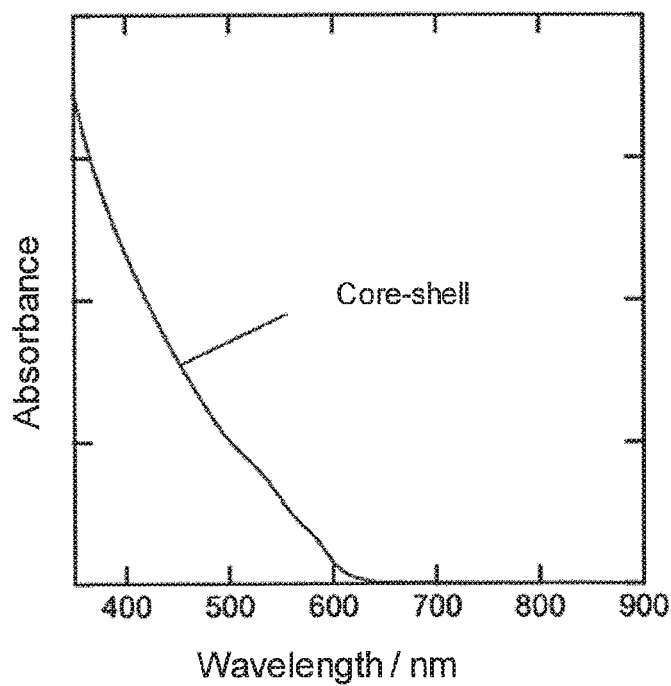
FIG. 5 shows an absorption spectrum of the core-shell semiconductor nanoparticles (core-shell) produced in Comparative Example 1.

For the resultant core-shell semiconductor nanoparticles, the absorption and emission spectra were measured as in Example 1. The results are shown in FIGS. 5 and 6, respectively.

The absorption spectrum of the core-shell semiconductor nanoparticles has a slight shoulder at around 500 nm, and there is substantially no absorption at around 600 nm or more, which allows an inference that there is an exciton peak at from around 400 nm to 600 nm.

Figure 6:
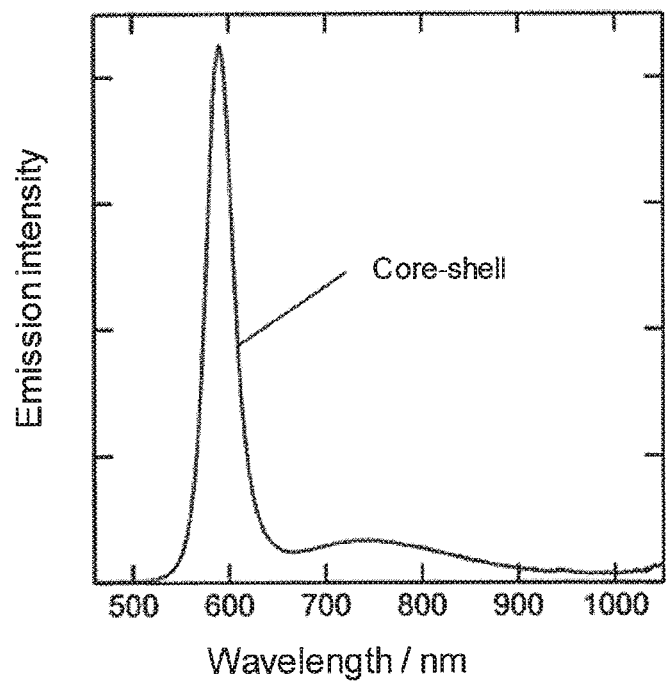
FIG. 6 shows an emission spectrum of the core-shell semiconductor nanoparticles (core-shell) produced in Comparative Example 1.

Also, as shown in FIG. 6, a band-edge emission with a half-bandwidth of about 34 nm is observed at around 591 nm, and the band-edge emission had a quantum yield of 9.8%, the purity of the band-edge emission component was 62.1%, and the band-edge emission had an intensity ratio of 0.93.

Comparative Example 2

To the semiconductor nanoparticles (core) synthesized in the same manner as in Example 1 and dispersed in 2 mL of oleylamine, 2 mL of trioctylphosphine (TOP) was added. After mixing by shaking at room temperature for 10 min, the mixture was left to stand at room temperature for 24 hours to obtain a fluid dispersion of TOP-modified semiconductor nanoparticles.

For the semiconductor nanoparticles and the resultant TOP-modified semiconductor nanoparticles, the emission spectra were measured as in Example 1. The respective results are shown in FIG. 7.

Figure 7:
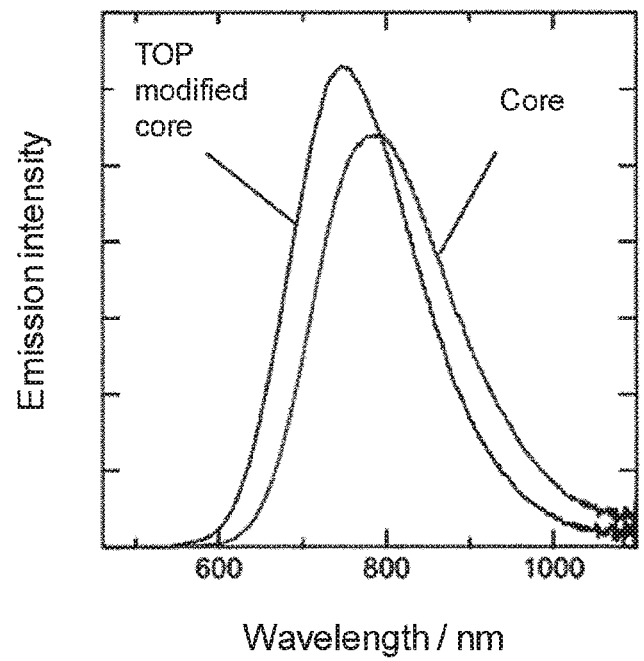
FIG. 7 shows emission spectra of the semiconductor nanoparticles (core) and the TOP-modified core-shell semiconductor nanoparticles produced in Comparative Example 2.

As shown in FIG. 7, the TOP-modified semiconductor nanoparticles show no band-edge emission, but a broad emission.

Example 2

Synthesis of Semiconductor Nanoparticles

In a reaction vessel, 0.4 mmol of AgOAc, 0.16 mmol of In(acac)$_3$, 0.24 mmol of Ga(acac)$_3$, and 11.8 mL of oleylamine were mixed, and dodecanethiol (0.83 mmol, 200 µL) was added. The synthesis solution was degassed and purged with a nitrogen atmosphere, the temperature was raised to about 50° C. with a hot-water bath, and, with the lid being temporarily open, thiourea (0.8 mmol, 60.8 mg) was added to obtain a first mixture. This is followed by degassing for a very short time, and after nitrogen was introduced again, the temperature was raised at a temperature raising rate of 10° C./min until it reached 150° C. After the actual measurement reached 150° C., heat treatment was continued for 600 sec. The reaction vessel was then immersed in hot water at about 50° C., and quenched (immediately after the start of quench at a temperature decreasing rate of about 90° C./min, and thereafter at about 37° C./min on average until it reached 60° C.) to halt synthesis. After removal of coarse particles by centrifugation, methanol was added to the supernatant to precipitate semiconductor nanoparticles that serve as the core. The precipitate was washed once with methanol, vacuum-dried for 30 min, and dispersed in 5 mL of hexane.

Synthesis of Core-Shell Semiconductor Nanoparticles 0.1 mol of Ga(acac)$_3$ and 0.15 mol of 1,3-dimethylthiourea were measured, and 7.79 g of tetradecylamine and 3.3 mL of the hexane dispersion of the semiconductor nanoparticles synthesized above (the amount-of-substance in terms of nanoparticles was about 60 nmol) were added to obtain a second mixture. The reaction vessel was degassed, and after nitrogen was introduced, stirring was started, and the temperature was raised to about 50° C. with a hot-water bath to melt tetradecylamine(TDA). The temperature was then raised at a temperature raising rate of 10° C./min until it reached 270° C., and heat treatment was carried out at 270° C. for 60 min. Subsequently, the temperature was decreased to 100° C. under room temperature, and vacuuming was carried out once to remove volatile components, such as hydrogen sulfide. When the temperature was further decreased to about 60° C., 3 mL of hexane was added to the reaction solution to reduce solidification of tetradecylamine. The contents were taken out, and coarse particles were precipitation-separated by centrifugation. To the supernatant, methanol was then added to precipitate core-shell particles, the precipitate was washed once with methanol, and the resultant core-shell particles were then dispersed in hexane (3 mL).

Measurement of Absorption and Emission Spectra and Quantum Yields

Figure 8:
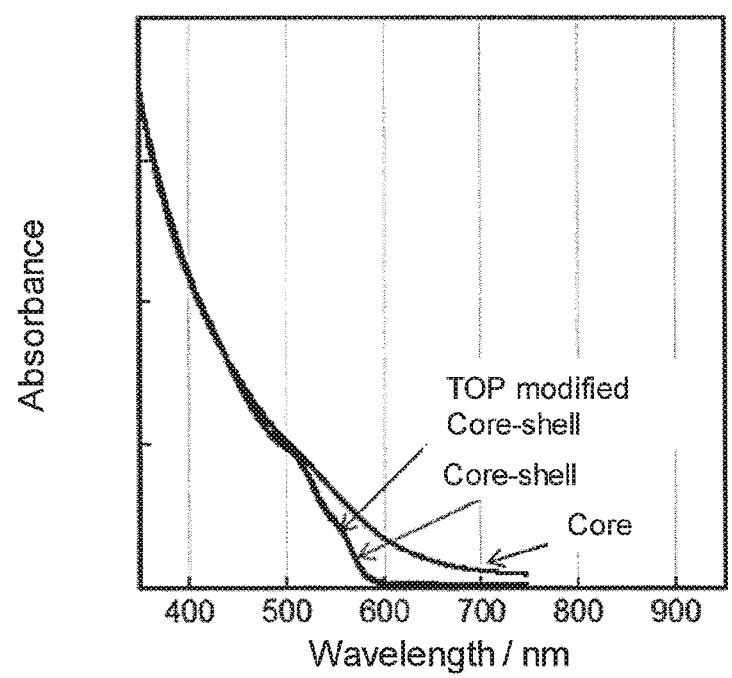
FIG. 8 shows absorption spectra of the semiconductor nanoparticles (core), the core-shell semiconductor nanoparticles (core-shell), and the TOP-modified core-shell semiconductor nanoparticles produced in Example 2.
Figure 9:
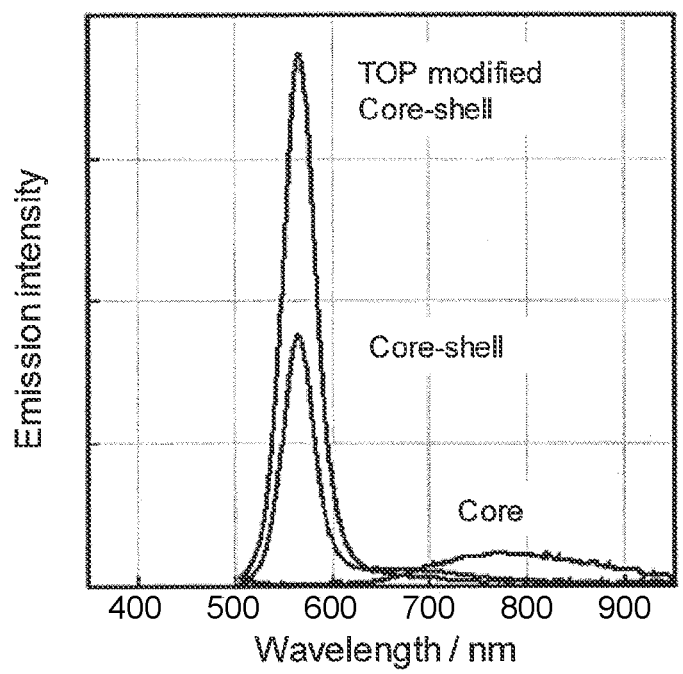
FIG. 9 shows emission spectra of the semiconductor nanoparticles (core), the core-shell semiconductor nanoparticles (core-shell), and the TOP-modified core-shell semiconductor nanoparticles produced in Example 2.

The absorption and emission spectra of the core-shell semiconductor nanoparticles were measured. The results are shown in FIGS. 8 and 9. The absorption spectrum was measured using a UV-Vis-NIR spectrophotometer (trade name: U-2900 by Hitachi High-Technologies) in the wavelength range of from 350 nm to 750 nm. The emission spectrum was measured using a Quantum Efficiency Measurement System (trade name: QE-2100 by Otsuka Electronics) at room temperature (25° C.) and at an excitation wavelength of 450 nm. The quantum yield was calculated from the spectrum measured with the same device in the wavelength range of from 506 nm to 882 nm.

As shown in FIG. 8, the absorption spectrum of the core-shell semiconductor nanoparticles has a shoulder at around 500 nm, and there is substantially no absorption at around 600 nm or more, which allows an inference that there is an exciton peak at from around 400 nm to 600 nm. As shown in Table 3, a band-edge emission with a half-bandwidth of about 36 nm is observed at around 567 nm, and the quantum yield of the band-edge emission was 23.6%. The purity of the band-edge emission component was 69.5%, and the intensity ratio of the band-edge emission was 0.93.

Examples 3 to 6 and Comparative Examples 3 to 6

Semiconductor nanoparticles were synthesized in the same manner as in Example 2 except that the organic solvent and the heat-treatment temperature and heat-treatment time were changed as shown in Table 3 in the synthesis of semiconductor nanoparticles. In the Table, OLA refers to oleylamine, and TDA refers to tetradecylamine.

1.5 ml of the hexane dispersion of the core-shell semiconductor nanoparticles obtained in Example 2 was taken into a test tube, and, after removal by evaporation of hexane in nitrogen stream, 1.5 ml of chloroform was added. To this, the same amount of trioctylphosphine (TOP) was added, the top of the test tube was filled with nitrogen and hermetically sealed, and stirred at room temperature for 24 hours to obtain a fluid dispersion of TOP-modified core-shell semiconductor nanoparticles.

For the resultant TOP-modified core-shell semiconductor nanoparticles, the quantum yield and emission spectrum were measured. Also, as shown In FIG. 8, the absorption spectrum of the TOP-modified core-shell semiconductor nanoparticles has a shoulder at around 500 nm, and there is substantially no absorption at around 600 nm or more, which allows an inference that there is an exciton peak at from around 400 nm to 600 nm. As shown in FIG. 10, a band-edge emission with a half-bandwidth of about 39 nm is observed at around 569 nm, and the quantum yield of the band-edge emission was 51.8%. The purity of the band-edge emission component was 83.1%, and the intensity ratio of the band-edge emission was 0.95.

From the above, it was confirmed that the band-edge emission has an improved quantum yield. It was also confirmed that by modifying the core-shell semiconductor nanoparticles with a specific modifier, the band-edge emission can have a further improved quantum yield.

The disclosures of Japanese Patent Applications No. 2018-025435 (filing date: Oct. 18, 2018) and No. 2018-196802 (filing date: Feb. 15, 2018) are incorporated herein by reference in their entireties. All pieces of the literature, the patent applications, and the technical standards described in the present specification are incorporated herein by reference to the same extent that each of these pieces of literature, each of these patent applications, and each of these technical standards are specifically and individually described to be incorporated herein by reference.

TABLE 3

| | Organic solvent | Heat treatment temperature (° C.) | Heat treatment time (sec) | Band-edge emission wavelength (nm) | Defect emission wavelength (nm) | Band-edge emission half-bandwidth (nm) | Band-edge emission intensity ratio | Band-edge emission purity (%) | Band-edge emission quantum yield (%) |
|---|---|---|---|---|---|---|---|---|---|
| Example 1 | OLA | 130 | 600 | 577 | 684 | 44 | 0.81 | 44.4 | 12.3 |
| Example 1 TOP modified | | | | 579 | 660 | 46 | 0.89 | 67.1 | 31.7 |
| Example 2 | OLA | 150 | 600 | 567 | 641 | 36 | 0.93 | 69.5 | 23.6 |
| Example 2 TOP modified | | | | 569 | 585 | 39 | 0.95 | 83.1 | 51.8 |
| Example 3 | TDA | 150 | 5 | 556 | 607 | 31 | 0.91 | 65.4 | 23.5 |
| Example 4 | TDA | 150 | 30 | 562 | 622 | 34 | 0.94 | 71.2 | 21.6 |
| Example 5 | TDA | 150 | 60 | 558 | 617 | 35 | 0.95 | 75.4 | 24.3 |
| Example 6 | TDA | 160 | 5 | 560 | 615 | 37 | 0.92 | 67.7 | 17.9 |
| Comparative Example 1 | OLA | 200 | 0 | 591 | 722 | 34 | 0.93 | 62.1 | 9.8 |
| Comparative Example 3 | OLA | 180 | 0 | 546 | 653 | 59 | 0.52 | 27.6 | 2.3 |
| Comparative Example 4 | TDA | 120 | 5 | — | 592 | — | — | 0.0 | 0.0 |
| Comparative Example 5 | TDA | 150 | 0 | — | 640 | — | — | 0.0 | 0.0 |
| Comparative Example 6 | TDA | 160 | 0 | 568 | 643 | 40 | 0.86 | 52.5 | 7.6 |

We claim:

1. A method of producing semiconductor nanoparticles, the method comprising:
   raising a temperature of a first mixture containing an Ag salt, a salt that contains at least one of In and Ga, a solid compound that contains thiourea and serves as a supply source of S, and an organic solvent to a temperature in a range of from 125° C. to 175° C.;
   heat-treating, subsequent to the raising the temperature, the first mixture at a temperature in the range of from 125° C. to 175° C. for three seconds or more to obtain a solution containing semiconductor nanoparticles; and
   decreasing a temperature of the solution containing the semiconductor nanoparticles.

2. The method according to claim 1, wherein the first mixture is obtained by adding the solid compound to a solution containing an Ag salt, a salt containing at least one of In and Ga, and an organic solvent.

3. The method according to claim 1, wherein the solid compound has an average particle diameter of from 1 mm to 5 mm.

4. The method according to claim 1, wherein the decreasing the temperature includes a period with a decreasing rate of 50° C./min or more.

5. A method of producing core-shell semiconductor nanoparticles, the method comprising:
   obtaining a second mixture containing the semiconductor nanoparticles produced by the method according to claim 1, a compound containing a Group 13 element, and a Group 16 element in a form of a single substance or a compound containing a Group 16 element; and
   heat-treating the second mixture to obtain core-shell semiconductor nanoparticles.

6. The method according to claim 5, further comprising contacting the core-shell semiconductor nanoparticles with a compound containing a Group 15 element.

* * * * *